(12) United States Patent
Bailey et al.

(10) Patent No.: US 7,365,530 B2
(45) Date of Patent: Apr. 29, 2008

(54) METHOD AND APPARATUS FOR VIBRATION DETECTION

(75) Inventors: James M. Bailey, Concord, NH (US); Michael C. Doogue, Manchester, NH (US); Jay M. Towne, Newbury, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 95 days.

(21) Appl. No.: 10/942,577

(22) Filed: Sep. 16, 2004

(65) Prior Publication Data

US 2005/0225319 A1    Oct. 13, 2005

Related U.S. Application Data

(63) Continuation-in-part of application No. 10/820,957, filed on Apr. 8, 2004.

(51) Int. Cl.
*G01B 7/14* (2006.01)
(52) U.S. Cl. .............................. 324/207.25; 324/207.26
(58) Field of Classification Search ........... 324/207.25, 324/207.26
See application file for complete search history.

(56) References Cited

U.S. PATENT DOCUMENTS

| | | |
|---|---|---|
| 3,304,434 A | 2/1967 | Koster |
| 4,185,265 A | 1/1980 | Griffin et al. |
| 4,225,939 A | 9/1980 | Yashiro |
| 4,283,679 A | 8/1981 | Ito et al. |
| 4,293,814 A | 10/1981 | Boyer |
| 4,367,721 A | 1/1983 | Boyer |
| 4,374,333 A | 2/1983 | Avery |

(Continued)

FOREIGN PATENT DOCUMENTS

DE        38 15 530 A1    11/1989

(Continued)

OTHER PUBLICATIONS

Forrest et al; U.S. Appl. No. 11/085,648, filed Mar. 21, 2005.

(Continued)

*Primary Examiner*—Reena Aurora
(74) *Attorney, Agent, or Firm*—Daly, Crowley, Mofford & Durkee, LLP

(57) ABSTRACT

Apparatus for detecting vibration of an object adapted to rotate includes one or more vibration processors selected from: a direction-change processor adapted to detect changes in a direction of rotation of the object, a direction-agreement processor adapted to identify a direction of rotation of the object in at least two channels and identify an agreement or disagreement in direction of rotation identified by the at least two channels, a phase-overlap processor adapted to identify overlapping signal regions in signals associated with the rotation of the object, and a running mode processor adapted to identify an unresponsive output signal from at least one of the at least two channels. A method for detecting the vibration of the object includes generating at least one of a direction-change output signal with the direction-change processor, a direction-agreement output signal with the direction-agreement processor, a phase-overlap output signal with the phase-overlap processor, and a running-mode-vibration output signal with the running-mode processor, each indicative of the vibration the object.

12 Claims, 18 Drawing Sheets

U.S. PATENT DOCUMENTS

| | | |
|---|---|---|
| 4,443,716 A | 4/1984 | Avery |
| 4,476,901 A | 10/1984 | Sainen |
| 4,513,403 A | 4/1985 | Troy |
| 4,642,555 A | 2/1987 | Swartz et al. |
| 4,649,796 A | 3/1987 | Schmidt |
| 4,705,964 A | 11/1987 | Higgs |
| 4,893,027 A | 1/1990 | Krammerer et al. |
| 4,906,928 A | 3/1990 | Gard |
| 4,992,731 A | 2/1991 | Lorenzen |
| 5,099,197 A | 3/1992 | Hauck et al. |
| 5,291,133 A | 3/1994 | Gokhale et al. |
| 5,317,258 A | 5/1994 | Setzer et al. |
| 5,332,956 A | 7/1994 | Oh |
| 5,442,283 A | 8/1995 | Vig et al. |
| 5,459,398 A | 10/1995 | Hansen et al. |
| 5,477,142 A | 12/1995 | Good et al. |
| 5,486,759 A | 1/1996 | Seiler et al. |
| 5,493,219 A | 2/1996 | Makino et al. |
| 5,497,084 A | 3/1996 | Bicking |
| 5,510,706 A | 4/1996 | Good |
| 5,650,719 A | 7/1997 | Moody et al. |
| 5,694,038 A | 12/1997 | Moody et al. |
| 5,696,790 A | 12/1997 | Graham et al. |
| 5,729,130 A | 3/1998 | Moody et al. |
| 5,917,320 A | 6/1999 | Scheller et al. |
| 6,091,239 A | 7/2000 | Vig et al. |
| 6,242,904 B1 | 6/2001 | Shirai et al. |
| 6,242,905 B1 | 6/2001 | Draxelmayr |
| 6,279,248 B1 | 8/2001 | Walters |
| 6,297,627 B1 | 10/2001 | Towne et al. |
| 6,492,804 B2 * | 12/2002 | Tsuge et al. ............... 324/166 |
| 6,653,968 B1 | 11/2003 | Schneider |
| 6,693,419 B2 | 2/2004 | Stauth et al. |
| 6,815,944 B2 | 11/2004 | Vig et al. |
| 7,184,876 B2 | 2/2007 | Teulings et al. |
| 2001/0002791 A1 | 6/2001 | Tsuge et al. |
| 2004/0062362 A1 | 4/2004 | Matsuya |
| 2005/0024042 A1 | 2/2005 | Block et al. |
| 2005/0040814 A1 | 2/2005 | Vig et al. |
| 2005/0068023 A1 | 3/2005 | Walter et al. |
| 2005/0122098 A1 | 6/2005 | Block et al. |
| 2005/0194970 A1 | 9/2005 | Scheller et al. |
| 2005/0225318 A1 | 10/2005 | Bailey et al. |
| 2005/0225319 A1 | 10/2005 | Bailey et al. |
| 2005/0278136 A1 | 12/2005 | Werth |

FOREIGN PATENT DOCUMENTS

| | | |
|---|---|---|
| DE | 196 50 935 A1 | 6/1998 |
| DE | 197 17 364 C1 | 8/1998 |
| DE | 199 61 504 A1 | 6/2001 |
| WO | WO 96/23198 | 1/1996 |
| WO | WO 03/069358 A3 | 8/2003 |
| WO | WO 03/098230 A1 | 11/2003 |
| WO | WO 03/098299 A1 | 11/2003 |
| WO | WO 03/100352 A1 | 12/2003 |

OTHER PUBLICATIONS

PCT Search Report of the ISA for PCT/US2003/02489 dated Nov. 19, 2005.

Partial International Search Report for PCT/US2003/02489 issued for the related PCT application; form PCT/ISA/206; Oct. 2, 2003; 2 pages.

Infineon Technologies; "Differential Two-Wire Hall Effect IC;" TLE4942 Preliminary Data Sheet; Jun. 2000; pp. 1-13.

Robert Bosch GMBH Stuttgart; "Active Sensor for ABS/ASR/VDC-Systems with 2-Wire-Current Interface;" Specification TLE4941/TLE4942; Version 5; Jul. 25, 2000; 44 pages.

Scheiler et al.; U.S. Appl. No. 10/795,930, filed Mar. 8, 2004.

Vig et al.; U.S. Appl. No. 10,948,808, filed Sep. 23, 2004.

PCT Search Report & WrittenOpenion of the ISA for PCT/US2006/007824 dated Jul. 7, 2006.

\* cited by examiner

METHOD AND APPARATUS FOR VIBRATION DETECTION

CROSS REFERENCE TO RELATED APPLICATIONS

This application is a Continuation-In-Part of and claims the benefit under 35 U.S.C. §120 of U.S. patent application Ser. No. 10/820,957 filed Apr. 8, 2004, which application is incorporated herein by reference in its entirety.

STATEMENT REGARDING FEDERALLY SPONSORED RESEARCH

Not Applicable.

FIELD OF THE INVENTION

This invention relates generally to vibration detection, and in particular, to vibration detection methods and apparatus that can identify a vibration in an object adapted to rotate in normal operation.

BACKGROUND OF THE INVENTION

Proximity detectors (also referred to herein as rotation detectors) for detecting ferrous or magnetic objects are known. One application for such devices is in detecting the approach and retreat of each tooth of a rotating ferrous object, such as a ferrous gear. The magnetic field associated with the ferrous object is often detected by one or more magnetic field-to-voltage transducers (also referred to herein as magnetic field sensors), such as Hall elements or magnetoresistive devices, which provide a signal proportional to a detected magnetic field (i.e., a magnetic field signal). The proximity detector processes the magnetic field signal to generate an output signal that changes state each time the magnetic field signal crosses a threshold. Therefore, when the proximity detector is used to detect the approach and retreat of each tooth of a rotating ferrous gear, the output signal is a square wave representative of rotation of the ferrous gear.

In one type of proximity detector, sometimes referred to as a peak-to-peak percentage detector (also referred to herein as a threshold detector), the threshold signal is equal to a percentage of the peak-to-peak magnetic field signal. One such peak-to-peak percentage detector is described in U.S. Pat. No. 5,917,320 entitled DETECTION OF PASSING MAGNETIC ARTICLES WHILE PERIODICALLY ADAPTING DETECTION THRESHOLD, which is assigned to the assignee of the present invention.

Another type of proximity detector, sometimes referred to as a slope-activated or a peak-referenced detector (also referred to herein as a peak detector) is described in U.S. Pat. No. 6,091,239 entitled DETECTION OF PASSING MAGNETIC ARTICLES WITH A PEAK-REFERENCED THRESHOLD DETECTOR, which is assigned to the assignee of the present invention. Another such peak-referenced proximity detector is described in U.S. Pat. No. 6,693,419 entitled PROXIMITY DETECTOR, which is assigned to the assignee of the present invention. In the peak-referenced proximity detector, the threshold signal differs from the positive and negative peaks (i.e., the peaks and valleys) of the magnetic field signal by a predetermined amount. Thus, in this type of proximity detector, the output signal changes state when the magnetic field signal comes away from a peak or valley by the predetermined amount.

In order to accurately detect the proximity of the ferrous object, the proximity detector must be capable of closely tracking the magnetic field signal. Typically, one or more digital-to-analog converters (DACs) are used to generate a DAC signal, which tracks the magnetic field signal. For example, in the above-referenced U.S. Pat. Nos. 5,917,320 and 6,091,239, two DACs are used; one to track the positive peaks of the magnetic field signal (PDAC) and the other to track the negative peaks of the magnetic field signal (NDAC). And in the above-referenced U.S. Pat. No. 6,693,419, a single DAC tracks both the positive and negative peaks of the magnetic field signal.

The magnetic field associated with the ferrous object and the resulting magnetic field signal are proportional to the distance between the ferrous object, for example the rotating ferrous gear, and the magnetic field sensors, e.g., the Hall elements, used in the proximity detector. This distance is referred to herein as an "air gap." As the air gap increases, the magnetic field sensors tend to experience a smaller magnetic field from the rotating ferrous gear, and therefore smaller changes in the magnetic field generated by passing teeth of the rotating ferrous gear.

Proximity detectors have been used in systems in which the ferrous object (e.g., the rotating ferrous gear) not only rotates, but also vibrates. For the ferrous gear capable of unidirectional rotation about an axis of rotation in normal operation, the vibration can have at least two vibration components. A first vibration component corresponds to a "rotational vibration," for which the ferrous gear vibrates back and forth about its axis of rotation. A second vibration component corresponds to "translational vibration," for which the above-described air gap dimension vibrates. The rotational vibration and the translational vibration can occur even when the ferrous gear is not otherwise rotating in normal operation. Both the first and the second vibration components, separately or in combination, can generate an output signal from the proximity detector that indicates rotation of the ferrous gear even when the ferrous gear is not rotating in normal operation.

Proximity detectors have been applied to automobile antilock brake systems (ABS) to determine rotational speed of automobile wheels. Proximity detectors have also been applied to automobile transmissions to determine rotating speed of transmission gears in order to shift the transmission at predetermined shift points and to perform other automobile system functions.

Magnetic field signals generated by the magnetic field sensors during vibration can have characteristics that depend upon the nature of the vibration. For example, when used in an automobile transmission, during starting of the automobile engine, the proximity detector primarily tends to experience rotational vibration, which tends to generate magnetic field signals having a first wave shape. In contrast, during engine idle, the proximity detector primarily tends to experience translational vibration, which tends to generate magnetic field signals having a second wave shape. The magnetic field signals generated during a vibration can also change from time to time, or from application to application, e.g., from automobile model to automobile model.

It will be understood that many mechanical assemblies have size and position manufacturing tolerances. For example, when the proximity detector is used in an assembly, the air gap can have manufacturing tolerances that result in variation in magnetic field sensed by the magnetic field sensors used in the proximity detector when the ferrous object is rotating in normal operation and a corresponding variation in the magnetic field signal. It will also be understood that the air gap can change over time as wear occurs in the mechanical assembly.

Some conventional proximity detectors perform an automatic calibration to properly operate in the presence of manufacturing tolerance variations described above. Calibration can be performed on the magnetic field signal in order to maintain an AC amplitude and a DC offset voltage within a desired range.

Many of the characteristics of a magnetic field signal generated in response to a vibration can be the same as or similar to characteristics of a magnetic field signal generated during rotation of the ferrous object in normal operation. For example, the frequency of a magnetic field signal generated during vibration can be the same as or similar to the frequency of a magnetic field signal generated during rotation in normal operation. As another example, the amplitude of a magnetic field signal generated in response to a vibration can be similar to the amplitude of a magnetic field signal generated during a rotation in normal operation. Therefore, the conventional proximity detector generates an output signal both in response to a vibration and in response to a rotation in normal operation. The output signal from the proximity detector can, therefore, appear the same, whether generated in response to a vibration or in response to a rotation in normal operation.

It may be adverse to the operation of a system, for example, an automobile system in which the proximity detector is used, for the system to interpret an output signal from the proximity detector to be associated with a rotation in normal operation when only a vibration is present. For example, an antilock brake system using a proximity detector to detect wheel rotation may interpret an output signal from the proximity detector to indicate a rotation of a wheel, when the output signal may be due only to a vibration. Therefore, the antilock brake system might not operate as intended.

It may also be undesirable to perform the above-described proximity detector calibration in response to a vibration rather than in response to a rotation in normal operation. Since the conventional proximity detector cannot distinguish a magnetic field signal generated in response to a rotation in normal operation from a magnetic field signal generated in response to a vibration, the proximity detector may perform calibrations at undesirable times when experiencing the vibration, and therefore, result in inaccurate calibration.

SUMMARY OF THE INVENTION

The present invention provides methods and apparatus for detecting a vibration of an object adapted to rotate in normal operation.

In accordance with the present invention, an apparatus for detecting a vibration in an object adapted to rotate includes a plurality of magnetic field sensors for generating an RDIFF signal proportional to a magnetic field at a first location relative to the object and an LDIFF signal proportional to a magnetic field at a second location relative to the object. The apparatus also includes at least two rotation detectors (also referred to alternatively as proximity detectors), one of which is coupled to at least one of the magnetic field sensors and is responsive to the RDIFF signal to provide a first output signal indicative of rotation of the object and the second one of which is also coupled to at least one of the magnetic field sensors and is responsive to the LDIFF signal to provide a second output signal indicative of rotation of the object. A vibration processor is responsive to the first and second output signals from the at least two rotation detectors for detecting the vibration of the object.

In one embodiment, the vibration processor includes at least one of a direction-change processor, a phase-overlap processor, and a direction-agreement processor. The direction-change processor is coupled to at least one of the rotation detectors to detect the vibration of the object in response to a change in the direction of rotation of the object as indicated by the output signal of the at least one rotation detector and to generate a direction-change output signal in response to the vibration. The phase-overlap processor identifies a first signal region associated with the RDIFF signal and a second signal region associated with the LDIFF signal, identifies an overlap of the first signal region and the second signal region, and generates a phase-overlap output signal in response to the overlap. The direction-agreement processor is coupled to the at least two rotation detectors to detect the vibration of the object in response to a disagreement in the direction of rotation of the object as indicated by output signals of the at least two rotation detectors and to generate a direction-agreement output signal in response to the vibration.

In accordance with yet another aspect of the present invention, a method for detecting a vibration in an object adapted to rotate includes providing a first output signal indicative of a rotation of the object with a first rotation detector, providing a second output signal indicative of the rotation of the object with a second rotation detector, detecting a change in direction of rotation of the object from the first and the second output signals, and generating a direction-change output signal in response to the change in direction In one particular embodiment, the method can also include providing a third output signal indicative of the rotation of the object with a third rotation detector, providing a fourth output signal indicative of the rotation of the object with a fourth rotation detector, detecting a first direction of rotation of the object with the first rotation detector and with the second rotation detector, detecting a second direction of rotation of the object with the third rotation detector and with the fourth rotation detector, determining whether the first direction of rotation is the same as the second direction of rotation, and generating a direction-agreement output signal in response to the determination.

In yet another particular embodiment, the method can include detecting a magnetic field with a first magnetic field sensor at a first location relative to the object to provide an RDIFF signal, detecting a magnetic field with a second magnetic field sensor at a second location relative to the object to provide an LDIFF signal, identifying a first signal region associated with the RDIFF signal and a second signal region associated with the LDIFF signal, identifying an overlap of the first signal region and the second signal region, and generating a phase-overlap output signal in response to the overlap.

In accordance with yet another aspect of the present invention, the vibration processor includes a running mode processor and at least one of the direction-change processor, the phase-overlap processor, and the direction-agreement processor. The running-mode processor is coupled to the rotation detectors to detect the vibration of the object in response to an unresponsive one of the first and second output signals from a respective one of the first and second rotation detectors and to generate a running-mode-vibration output signal indicative of the vibration.

In accordance with yet another aspect of the present invention, a method for detecting a vibration in an object adapted to rotate includes providing a first output signal indicative of a rotation of the object with a first rotation detector and providing a second output signal indicative of the rotation of the object with a second rotation detector. The method further includes detecting an unresponsive output signal from among the first and second output signals and generating a running-mode-vibration output signal in response to the unresponsive output signal.

With these particular arrangements, the apparatus and method can discriminate a vibration from a rotation of the object.

In accordance with yet another aspect of the present invention, a peak-referenced detector for detecting rotation of an object adapted to rotate includes a DIFF signal generator adapted to generate a DIFF signal associated with a varying magnetic field generated by the object when rotating. The peak-referenced detector also includes mean for identifying a positive peak value corresponding to a positive peak of the DIFF signal, means for identifying a negative peak value corresponding to a negative peak of the DIFF signal, means for generating a first threshold as a first predetermined percentage below the positive peak value, and means for generating a second threshold as a second predetermined percentage above the negative peak value. A comparator can be used for comparing the first and second thresholds to the DIFF signal to generate an output signal indicative of the rotation of the object. In one particular embodiment, the first and second predetermined thresholds can each be about fifteen percent.

With this particular arrangement, the peak-referenced detector can use thresholds that are predetermined percentages away from the positive and negative peaks of the DIFF signal, unlike a conventional peak-referenced detector that uses thresholds that are a predetermined value away from the positive and negative peaks of the DIFF signal.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "rotational vibration" refers to a back and forth rotation of an object about an axis of rotation, which object is adapted to rotate in a unidirectional manner about the axis of rotation in normal operation. As used herein, the term "translational vibration" refers to translation of the object and/or of magnetic field sensors used to detect magnetic fields generated by the object generally in a direction perpendicular to the axis of rotation. It should be recognized that both rotational vibration and translational vibration can cause signals to be generated by the magnetic field sensors.

Figure 1:
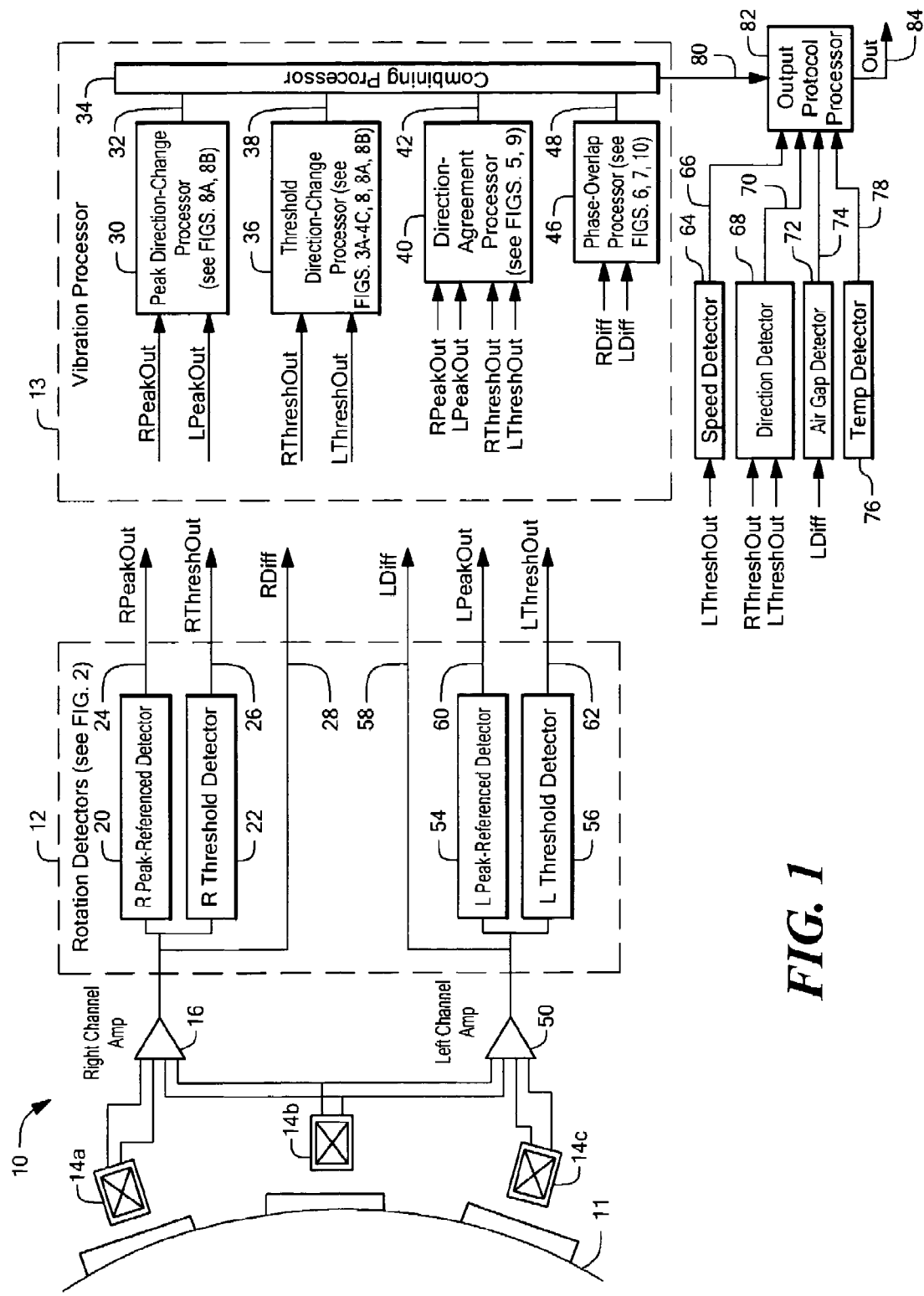
FIG. 1 is a block diagram of a sensor containing a vibration processor according to the invention.

Referring now to FIG. 1, an exemplary sensor 10 includes a plurality of magnetic field sensors 14*a*-14*c* for generating an RDIFF signal 28 proportional to a magnetic field at a first location relative to an object 11 and an LDIFF signal 58 proportional to a magnetic field at a second location relative to the object 11. As described more fully below, the first and second locations correspond to right and left channels. The object 11 can be an object adapted to rotate, for example, a ferrous gear, which, in addition to unidirectional rotation in normal operation, is also subject to undesirable rotational and translational vibrations. The sensor 10 includes a right channel amplifier 16 providing the RDIFF signal 28 and a left channel amplifier 50 providing the LDIFF signal 58.

The sensor 10 also includes rotation detectors 12, including at least two rotation detectors as at least one of a right channel threshold detector 22 and a right channel peak-referenced detector 20, and at least one of a left channel threshold detector 56 and a left channel peak-referenced detector 54.

The right channel threshold detector 22 is responsive to the RDIFF signal 28 and provides a first output signal 26 (RThreshOut) indicative of a rotation of the object. The left channel threshold detector 56 is responsive to the LDIFF signal 58 and provides a second output signal 62 (LThreshOut) also indicative of the rotation of the object. The right channel peak-referenced detector 20 is responsive to the RDIFF signal 28 and provides a third output signal 24 (RPeakOut) further indicative of the rotation of the object. The left channel peak-referenced detector 54 is responsive to the LDIFF signal 58 and provides a fourth output signal 62 (LThreshOut) still further indicative of the rotation of the object.

The designations "left" and "right" (also L and R, respectively) are indicative of physical placement of the magnetic field sensors 14a-14c relative to the object 11 and correspond to left and right channels, where a channel contains the signal processing circuitry associated with the respective magnetic field sensor(s). For example, the magnetic field sensors 14a, 14b differentially sense the magnetic field at a location to the right of the object 11 and the right channel contains circuitry for processing the magnetic field thus sensed (e.g., right channel amplifier 16, R Peak-referenced detector 20, and R threshold detector 22). In the illustrative embodiment, three magnetic field sensors are used for differential magnetic field sensing, with the central sensor 14b used in both channels. While three magnetic field sensors 14a-14c are shown, it should be appreciated that two or more magnetic field sensors can be used with this invention. For example, in an embodiment using only two magnetic field sensors 14a, 14b, magnetic field sensor 14a can be coupled to the right channel amplifier 16 and magnetic field sensor 14b can be coupled to the left channel amplifier 50. The right channel includes magnetic field sensors 14a and 14b, the right channel amplifier 16, the right channel peak-referenced detector 20, and the right channel threshold detector 22. The left channel includes magnetic field sensors 14b and 14c the left channel amplifier 50, the left channel peak-referenced detector 54, and the left channel threshold detector 56. It will be appreciated that right and left are relative terms, and, if reversed, merely result a relative phase change in the magnetic field signals. This will become more apparent below in conjunction with FIGS. 8A and 8B.

The sensor 10 also includes a vibration processor 13 responsive to output signals from at least two rotation detectors 20, 22, 54, 56 for detecting the vibration of the object. The vibration processor 13 includes at least one of a peak direction-change processor 30, a threshold direction-change processor 36, a direction-agreement processor 40, and a phase-overlap processor 46. In one particular embodiment, the vibration processor 13 contains the threshold direction-change processor 36, the direction-agreement processor 40, and the phase-overlap processor 46.

Figure 3:
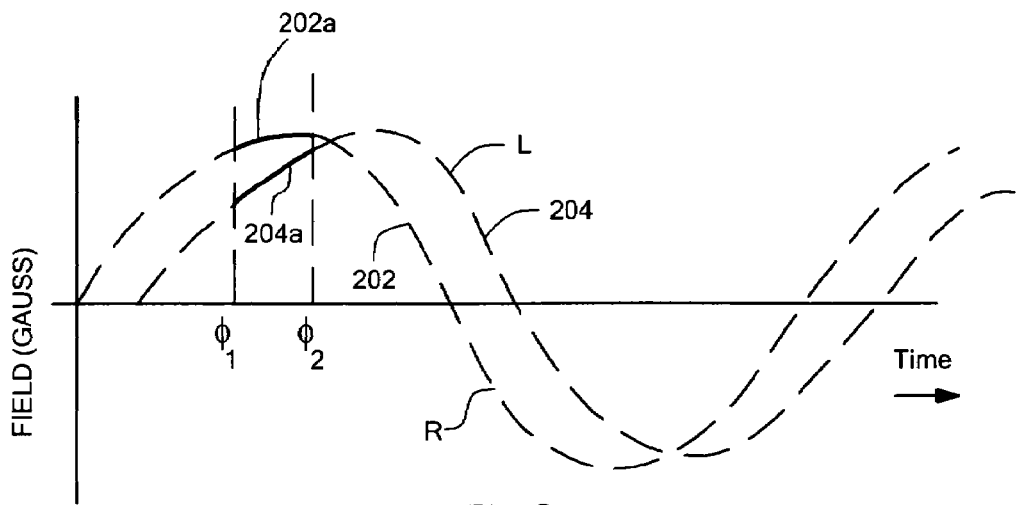
FIGS. 3-3B show a series of waveforms including magnetic fields, corresponding output signals of magnetic field sensors, corresponding output signals associated with rotation detectors, and corresponding output signals associated with a direction-change processor of FIG. 1 in response to a vibration of an object.
Figure 4:
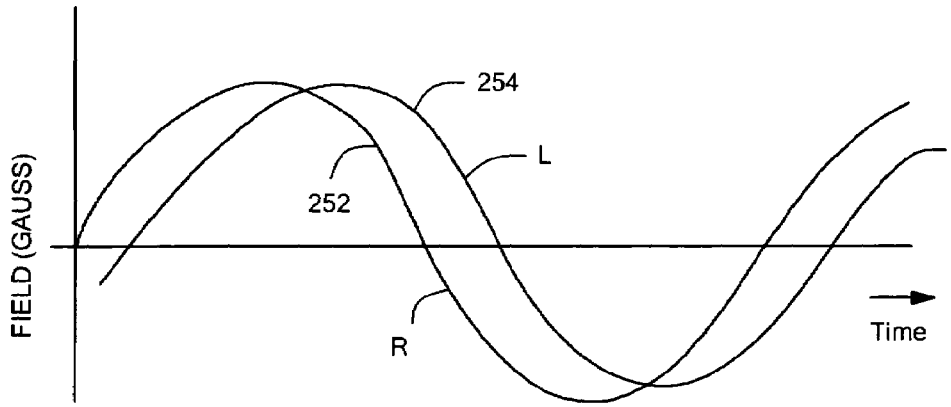
FIG. 4-4B show a series of waveforms including magnetic fields, corresponding output signals of magnetic field sensors, corresponding output signals associated with rotation detectors, and corresponding output signals associated with the direction-change processor of FIG. 1 in response to a rotation of the object in normal operation.
Figure 4A:
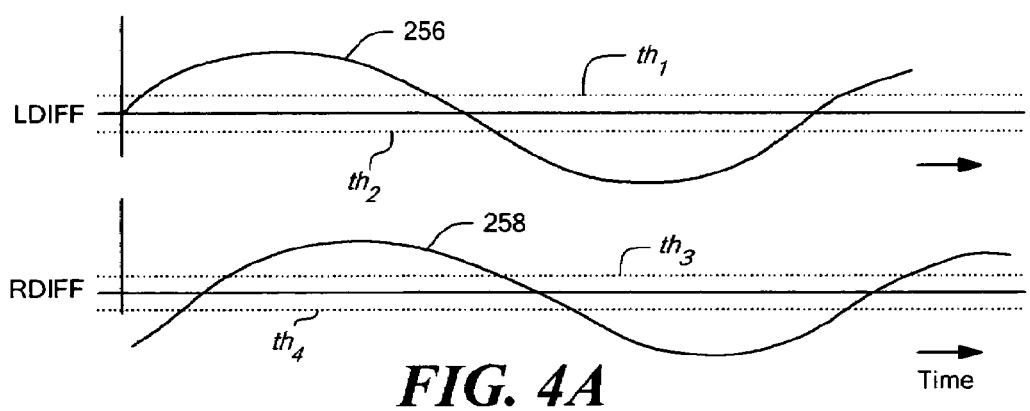
Figure 4B:
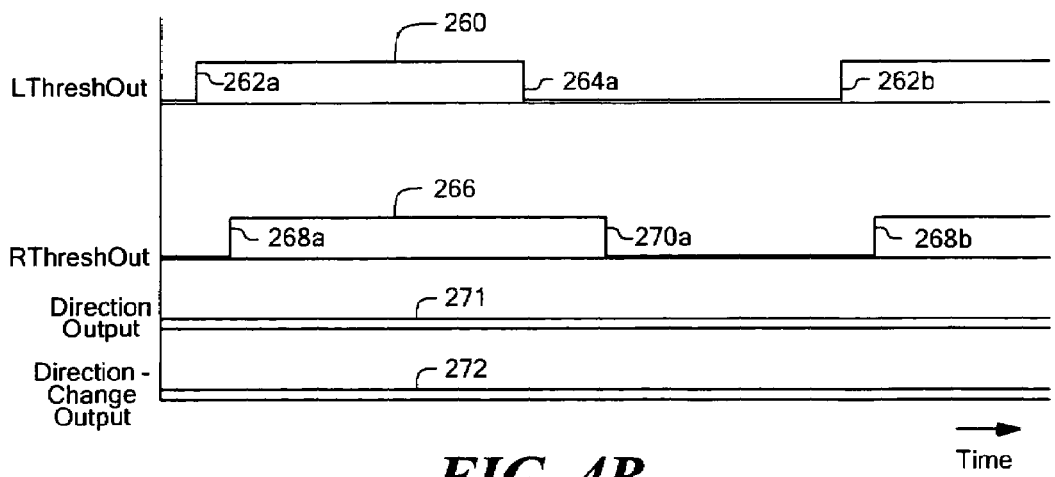
Figure 5:
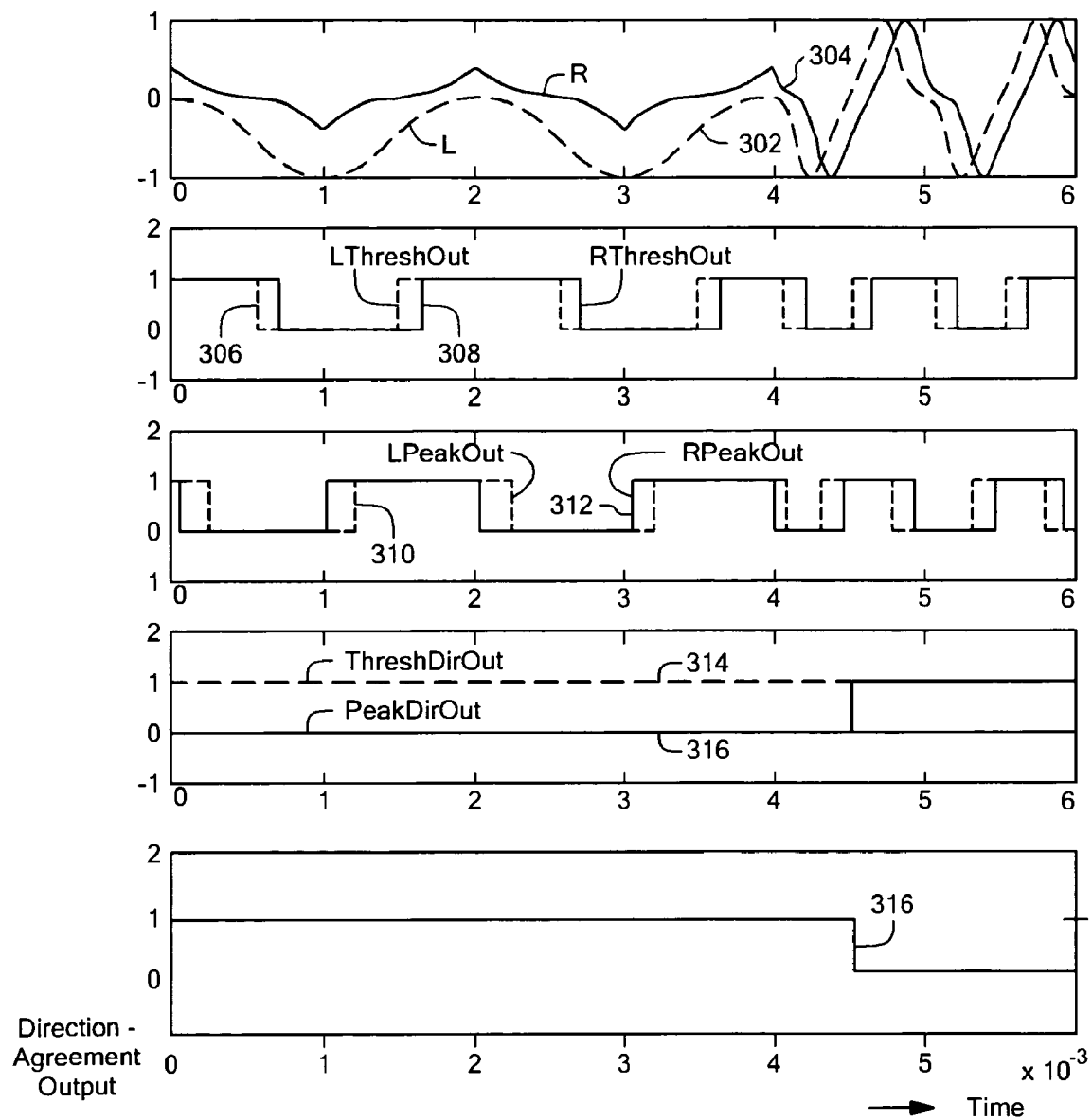
FIG. 5 shows a series of waveforms including magnetic fields, corresponding output signals associated with rotation detectors, and corresponding output signals associated with a direction-agreement processor of FIG. 1 in response to the vibration of the object and in response to the rotation of the object in normal operation.
Figure 6:
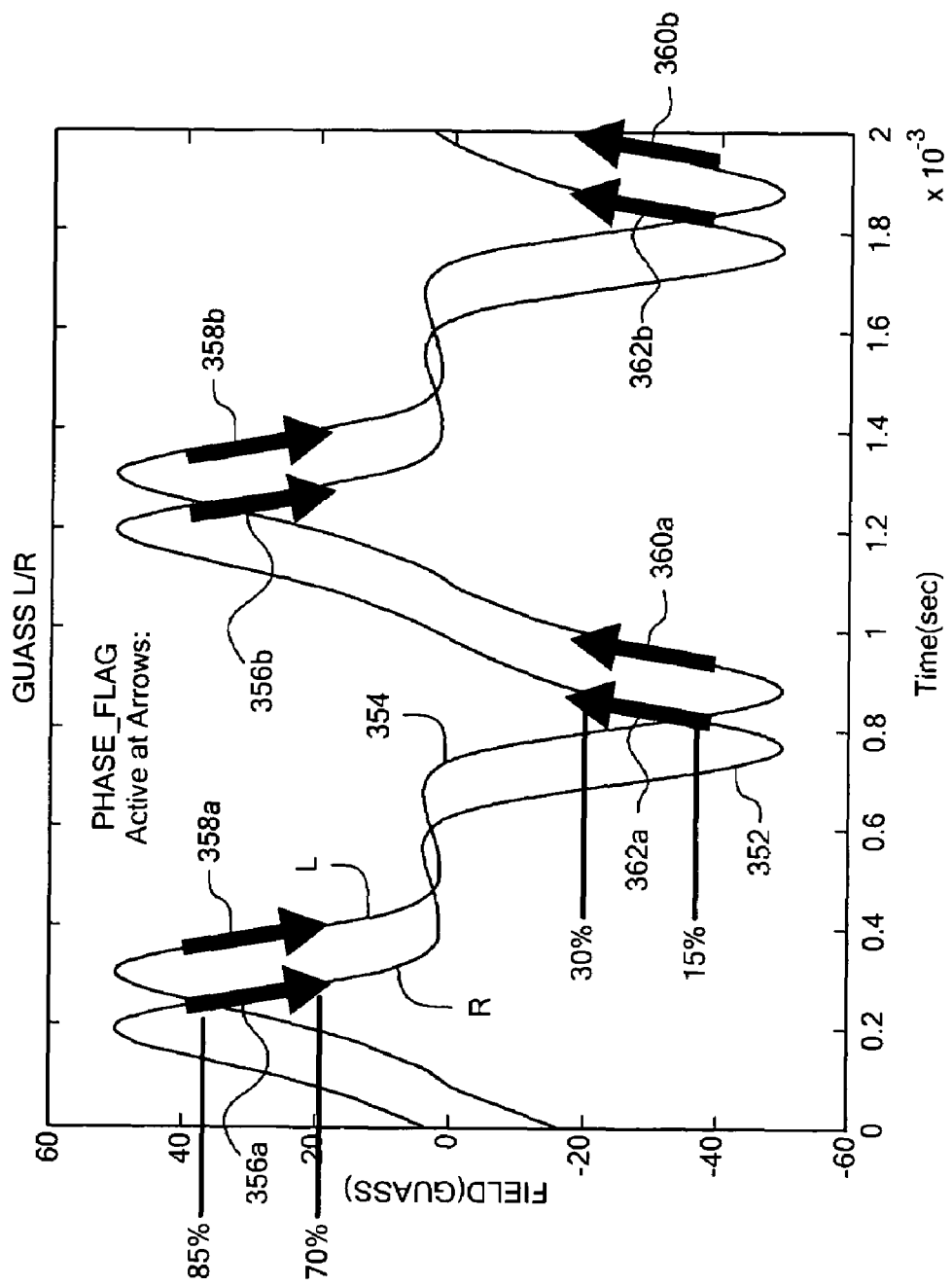
FIG. 6 is a graph showing magnetic fields associated with a phase-overlap processor of FIG. 1 in response to the rotation of the object in normal operation.
Figure 7:
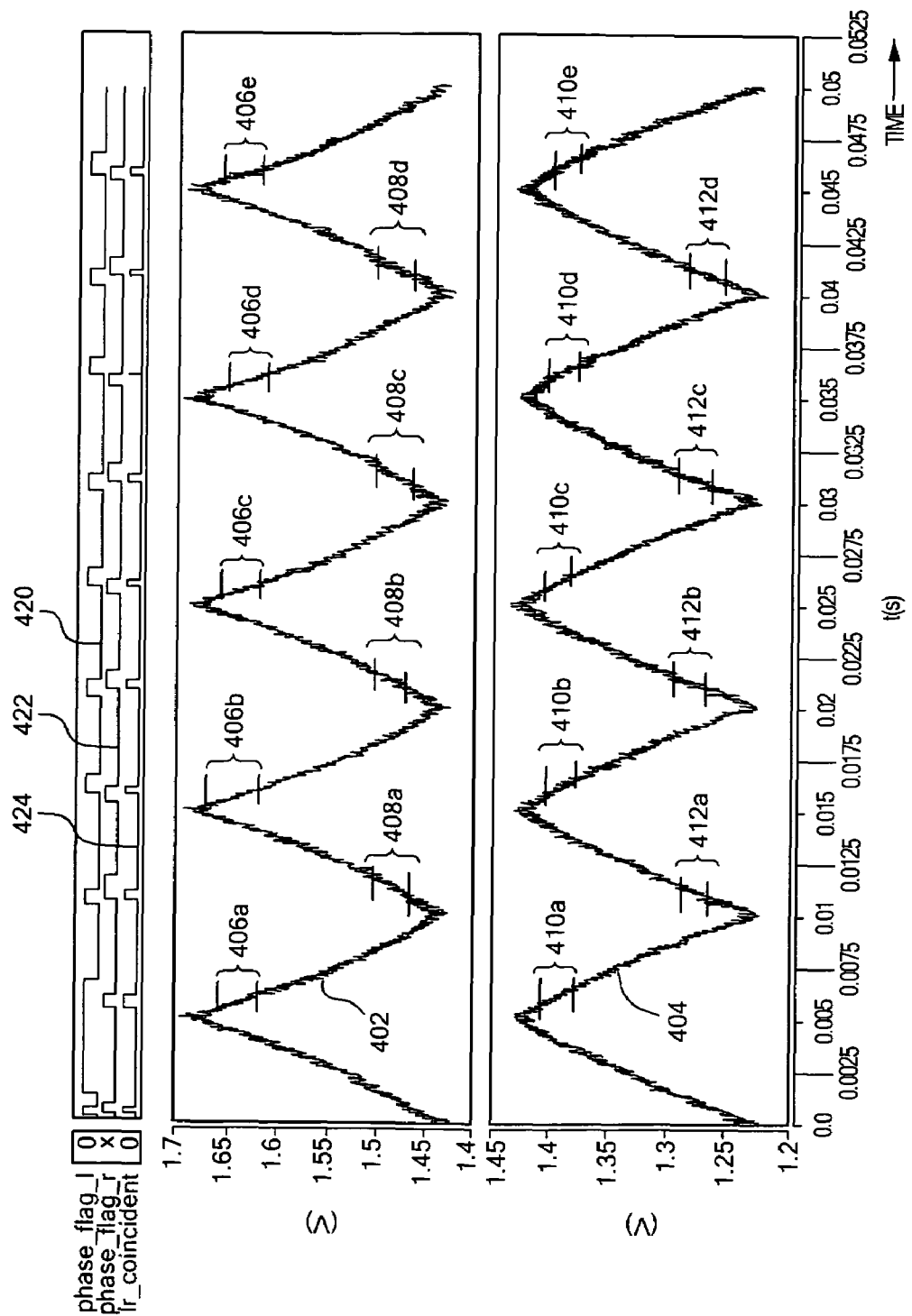
FIG. 7 is a graph showing magnetic field signals and other signals associated with the phase-overlap processor of FIG. 1 in response to a vibration.
Figure 8:
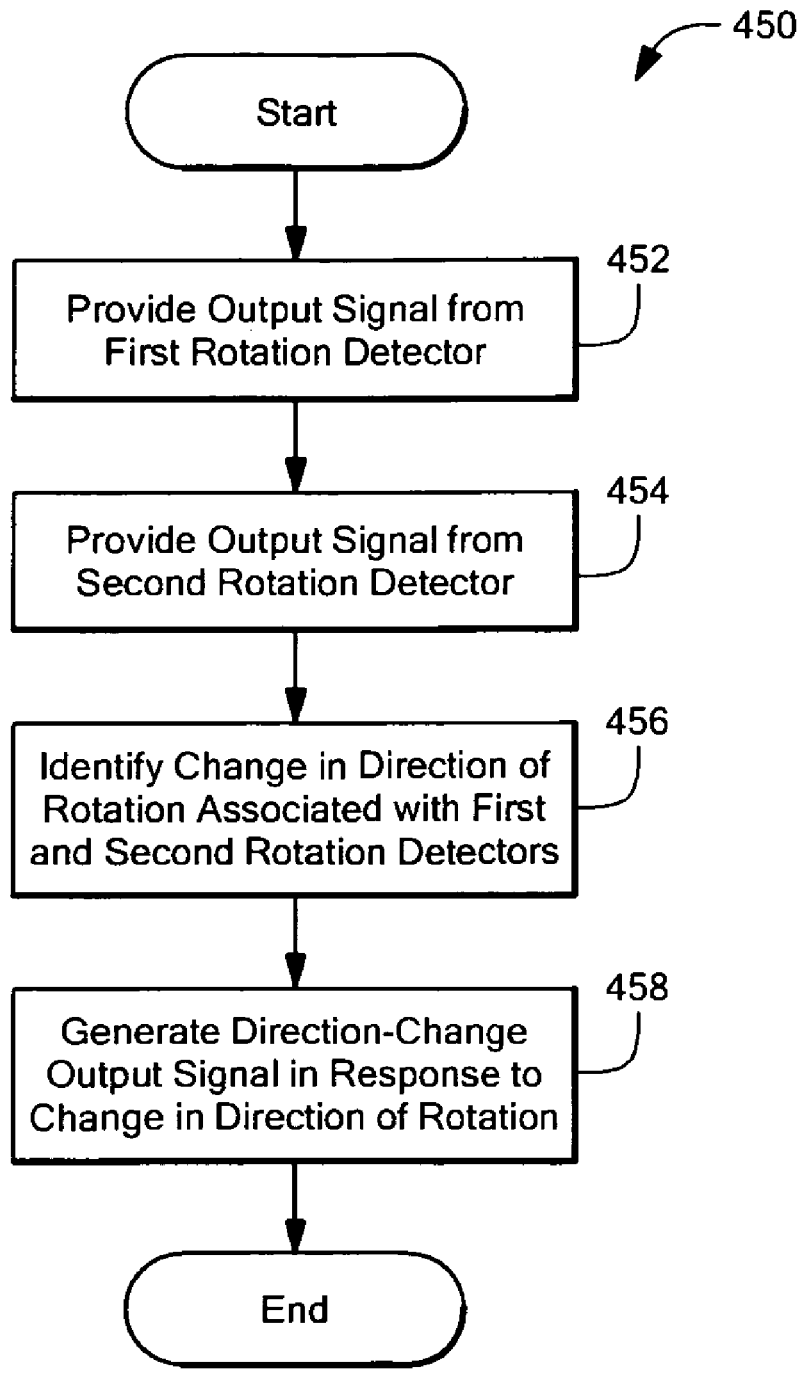
FIG. 8 is a flow chart showing a process of generating a direction-change output signal associated with the direction-change processor of FIG. 1.
Figure 8A:
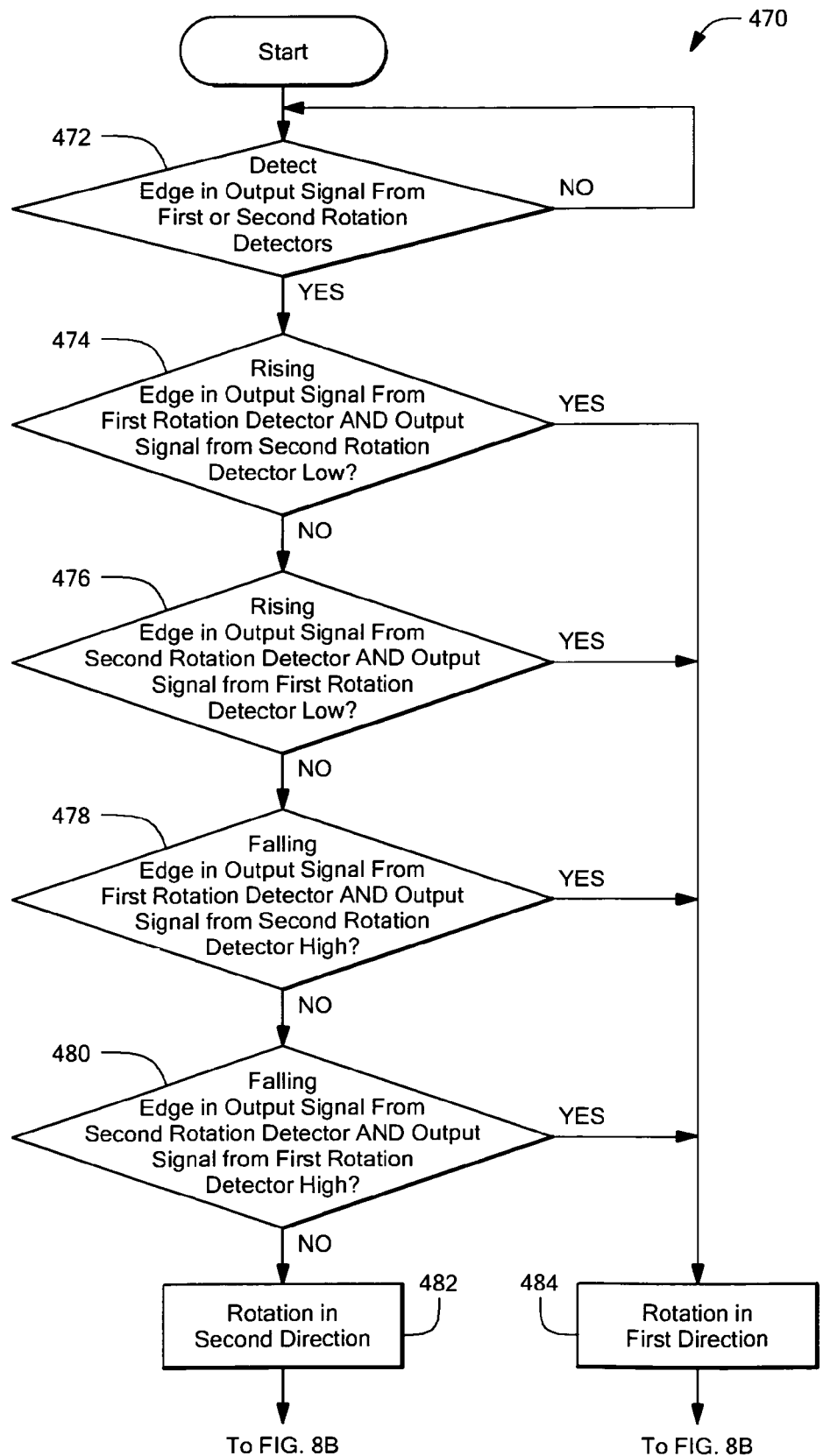
FIGS. 8A and 8B together are a flow chart showing further details of the process of FIG. 8.
Figure 9:
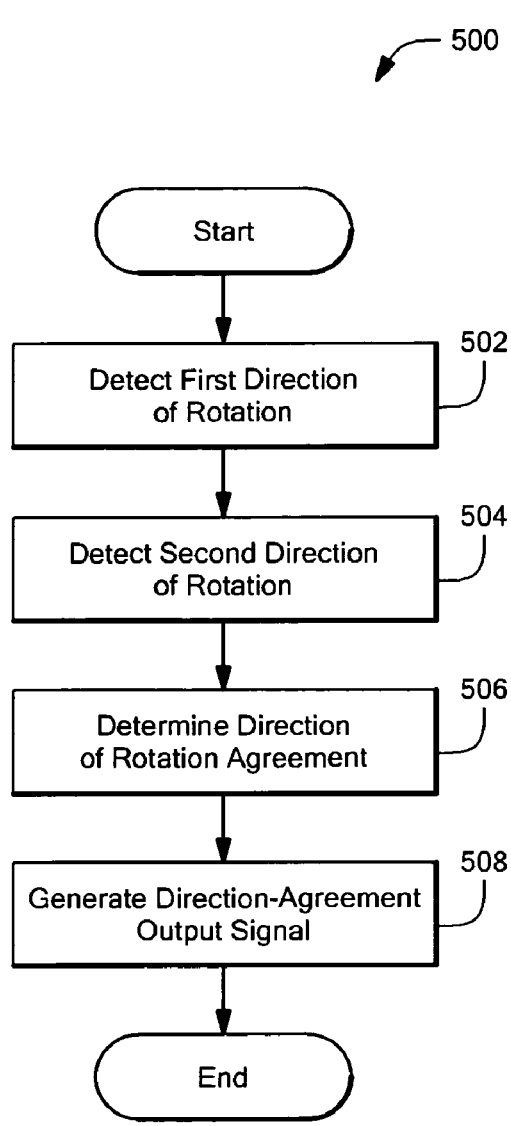
FIG. 9 is a flow chart showing a process of generating a direction-agreement output signal associated with the direction-agreement processor of FIG. 1.
Figure 10:
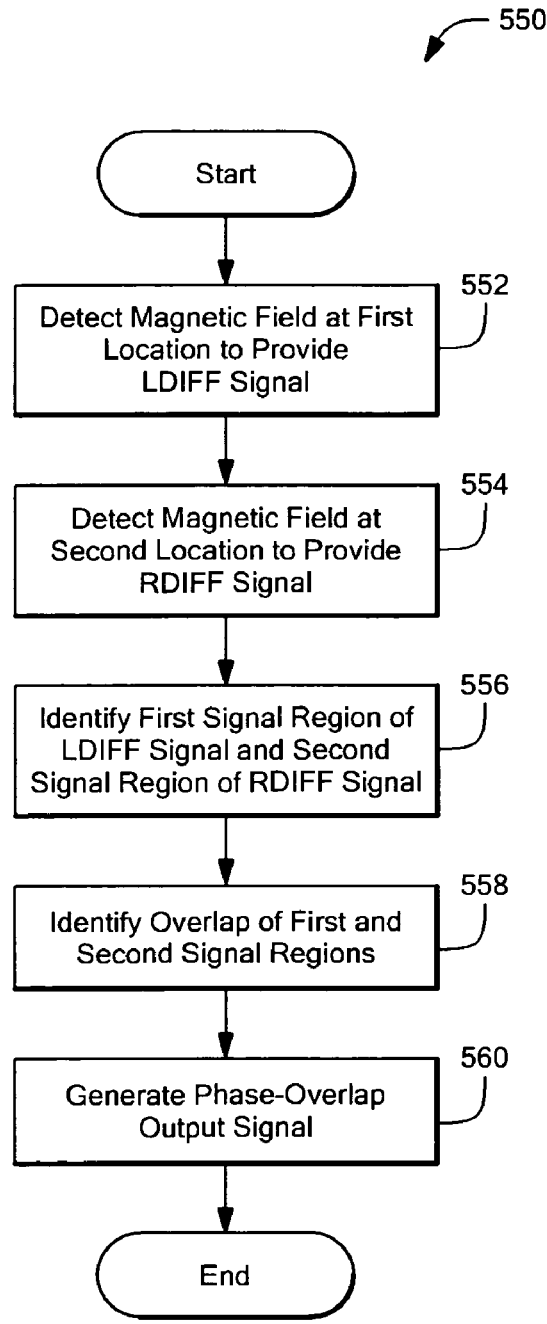
FIG. 10 is a flow chart showing a process of generating a phase-overlap output signal associated with the phase-overlap processor of FIG. 1.

The threshold direction-change processor 36 is described in greater detail in conjunction with FIGS. 3-4B, the peak direction-change processor 30 and the threshold direction-change processor 36 are described in greater detail in conjunction with FIGS. 8 and 8A, the direction-agreement processor 40 is described in greater detail in conjunction with FIGS. 5 and 9, and the phase-overlap processor 46 is described in greater detail in conjunction with FIGS. 6, 7, and 10. However, let it suffice here to say that the peak direction-change processor 30 and the threshold direction-change processor 36 detect the vibration of the object and generate respective direction-change output signals 32, 38 in response to the vibration. The direction-agreement processor 40 detects the vibration of the object and generates a direction-agreement output signal 42 in response to the vibration. The phase-overlap processor 46 also detects the vibration of the object and generates a phase-overlap output signal 48 in response to the vibration.

A combining processor 34 logically combines at least two of the direction-change output signal 38, the second direction-change output signal 32, the direction-agreement output signal 42, and the phase-overlap output signal 48 to provide a vibration-decision output signal 80 indicative of whether or not the object is vibrating. For example, in one particular embodiment, the logical combining is an OR function providing that if any of the direction-change output signal 38, the direction-change output signal 32, the direction-agreement output signal 42, and the phase-overlap output signal 48 indicates a vibration of the object, then the vibration-decision output signal 80 indicates the vibration accordingly, for example, as a high logic state.

However, in an alternate arrangement, the sensor 10, has one vibration processor, selected from among the peak-direction change processor 30, the threshold direction-change processor 36, the direction-agreement processor 40, and the phase-overlap processor 46, the selected one of which provides the vibration decision output signal 80.

It will become apparent from discussion below that the threshold direction-change processor 38, the peak direction-change processor 30, the direction-agreement processor 40, and the phase-overlap processor 46 can detect rotational vibration of the rotating object, for example, the rotating ferrous gear described above. It will also be apparent that the phase-overlap processor 46 can detect translational vibration of the object and/or of the magnetic field sensors 14a-14c. However, in other embodiments, any of the above-identified processors can be adapted to detect either the rotational vibration or the translational vibration or both.

The exemplary sensor 10 can also include a speed detector 64 to detect a rotational speed of the object and provide a corresponding speed output signal 66 indicative of a speed of rotation of the object, a direction detector 68 to detect a direction of rotation of the object and provide a corresponding direction output signal 70 indicative of the direction of rotation of the object, an air gap detector 72 to detect an air gap between one or more of the magnetic field sensors 14a-14c and the ferrous object and provide a corresponding air gap output signal 74 indicative of the air gap, and a temperature detector 76 to detect a temperature and provide a corresponding temperature output signal 78 indicative of the temperature.

An output protocol processor 82 is responsive to one or more of the output signals 66, 70, 74, 78 and to the vibration-decision output signal 80 for generating a sensor output signal 84 in accordance with the received signals. In one particular embodiment, for example, the output signal 84 has a first characteristic when the vibration-decision output signal 80 indicates a vibration, and a second characteristic when the vibration-decision output signal 80 indicates no vibration. For example, in one particular embodiment, the output signal 84 can be static (i.e., statically high or low) when the vibration-decision output signal 80 indicates the vibration, and can be active (e.g., an AC waveform having a frequency proportional to the speed output signal 66) when the vibration-decision output signal 80 indicates no vibration. In other embodiments, the output protocol processor 82 provides an encoded output signal 84 in accordance with one of more or output signals 66, 70, 74, 78, 80.

Figure 2:
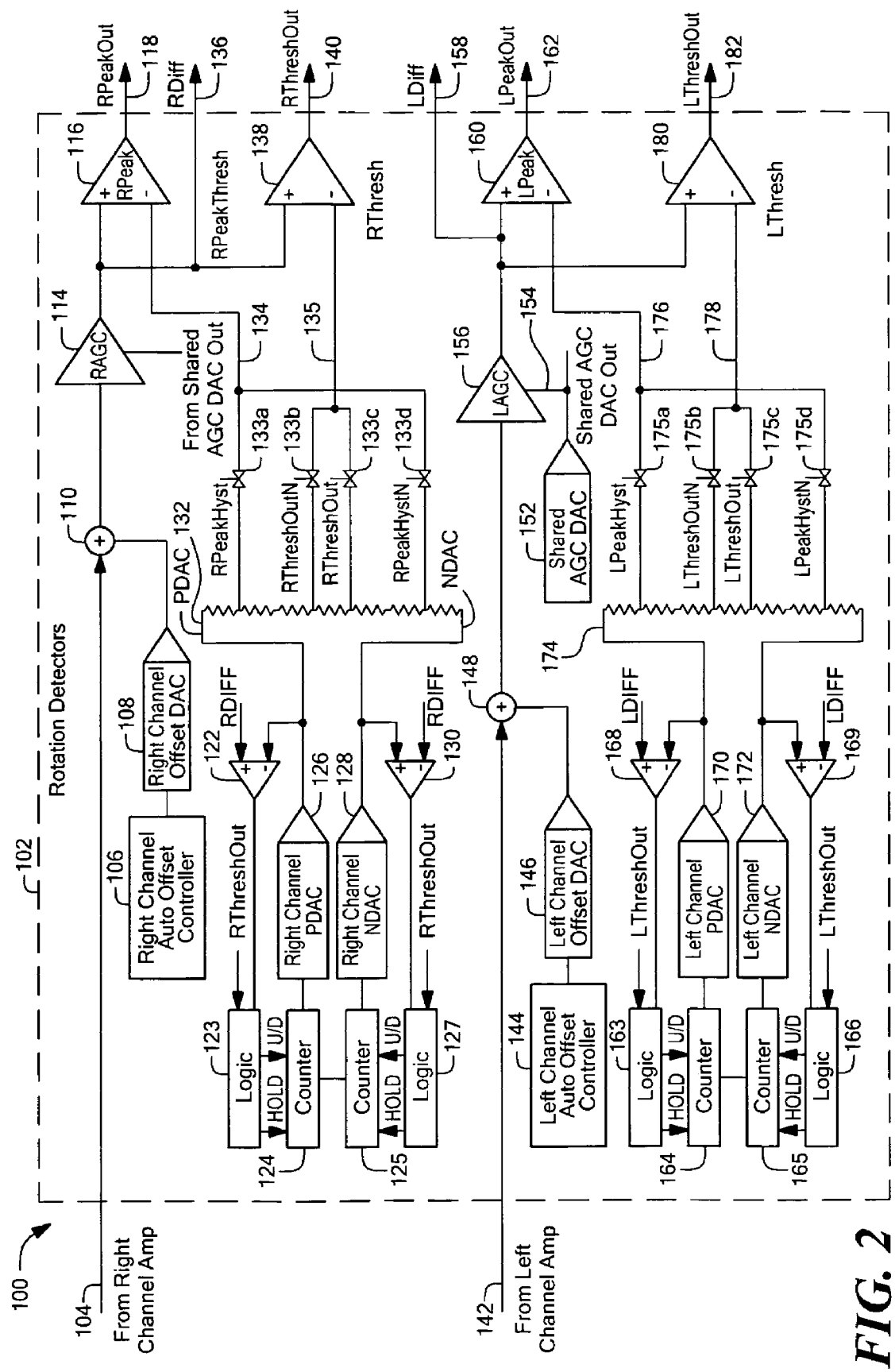
FIG. 2 is a block diagram showing rotation detectors that can be used in the sensor of FIG. 1 in greater detail.

Referring now to FIG. 2, exemplary rotation detectors 102, which correspond to the rotation detectors 12 of FIG. 1, are shown in greater detail. A right channel corresponds to an upper half of FIG. 2 and a left channel corresponds to a lower half of FIG. 2. It will be appreciated that the left channel has characteristics similar to the right channel. For simplicity, only the right channel is described herein.

An input signal 104 from a right channel amplifier, e.g., the right channel amplifier 16 of FIG. 1, can include an undesirable DC offset. A right channel auto offset controller 106, a right channel offset digital-to-analog converter (DAC) 108 and a summer 110 are provided in order to eliminate the DC offset by known techniques. A right channel automatic gain controller (RAGC) 114 provides an RDIFF signal 136 having an amplitude within a predetermined amplitude range. Control of the RAGC 114 is further described below. It should be understood that the RDIFF signal 136 is representative of the magnetic field experienced by one or more magnetic field sensors, for example, the magnetic field sensors 14a, 14b of FIG. 1.

The RDIFF signal 136 is provided to a right channel peak (RPeak) comparator 116 and to a right channel threshold (RThresh) comparator 138. The RPeak comparator 116 also receives a threshold voltage 134 and the RThresh comparator 138 receives a threshold voltage 135. Generation of the threshold voltages 134, 135 is further described in conjunction with FIGS. 2A and 2B.

The threshold voltage 134 switches between two values, a first one of which is a first predetermined percentage below a positive peak of the RDIFF signal 136 and a second one of which is a second predetermined percentage above a negative peak of the RDIFF signal 136. In one particular embodiment, the first and second predetermined percentages are each about fifteen percent. The first threshold voltage 134 is, therefore, relatively near to and below a positive peak of the RDIFF signal 136 or relatively near to and above a negative peak of the RDIFF signal 136. Therefore, the RPeak comparator 116 generates an RPeakOut signal 118 having edges closely associated with the positive and negative peaks of the RDIFF signal 136.

The threshold voltage 135 also switches between two values, a first one of which is a first predetermined percentage of the peak-to-peak amplitude of the RDIFF signal 136 and a second one of which is a second predetermined percentage of the peak-to-peak amplitude of the RDIFF signal 136. In one particular embodiment, the first predetermined percentage is about sixty percent and the second predetermined percentage is about forty percent of the peak-to-peak amplitude of the RDIFF signal 136. Therefore, the RThresh comparator 138 generates an RThreshOut signal 140 having edges relatively closely associated with the midpoint, or fifty percent point, between the positive peak and the negative peak of the RDIFF signal 136.

The threshold voltages 134, 135 are generated by counters 124, 125, logic circuits 123, 127, a right channel PDAC 126, a right channel NDAC 128, comparators 122, 130, a resistor ladder 132 and transmission gates 133a-133d. The comparator 122 receives the RDIFF signal 136 and an output from the right channel PDAC 126, and, by way of feedback provided by the logic circuit 123 and the counter 124, causes the output of the PDAC 126 (i.e., the PDAC voltage) to track and hold the positive peaks of the RDIFF signal 136. Similarly, the comparator 130 receives the RDIFF signal 136 and an output from the right channel NDAC 128, and, by way of feedback provided by the logic 127 and the counter 125, causes the output of the NDAC 128 (i.e., the NDAC voltage) to track and hold the negative peaks of the RDIFF signal 136. Therefore, the differential voltage between the output of the PDAC 126 and the output of the NDAC 128 represents the peak-to-peak amplitude of the RDIFF signal 136. The outputs of the PDAC 126 and the NDAC 128 are described below in greater detail in conjunction with FIG. 2A.

The PDAC and NDAC voltages are provided to opposite ends of the resistor ladder 132. The transmission gates 133a, 133d provide the threshold voltage 134 as one of two voltage values as described above, depending upon the control voltages RPeakHyst and its inverse RPeakHystN applied to the transmission gates 133a, 133d respectively. Similarly, the transmission gates 133b, 133c provide the threshold 135 voltage as one of two voltage values as described above, depending upon the control voltages RThreshOut 140 and its inverse RThreshOutN applied to the transmission gates 133c, 133b respectively.

It should be recognized from the discussion above that the two states of the threshold voltage 134 are closely associated with the positive peak and the negative peak of the RDIFF signal 136, while the two states of the threshold 135 are closely associated with a midpoint of the RDIFF signal 136. This difference is accomplished by way of the control signals applied to the transmission gates 133a, 133d compared to control signals applied to the transmission gates 133b, 133c. The control signals are further described below in conjunction with FIGS. 2A and 2B.

A shared AGC DAC 152 is shown in the lower half of FIG. 2, providing a shared AGC DAC output signal 154 to control the gain of both the RAGC 114 and LAGC 156 amplifiers. The shared AGC DAC output signal 154 causes both the right and the left channels to have the same gain. One of ordinary skill in the art will understand how to set the shared AGC DAC 152 to provide and appropriate shared AGC DAC output signal 154.

Figure 2A:
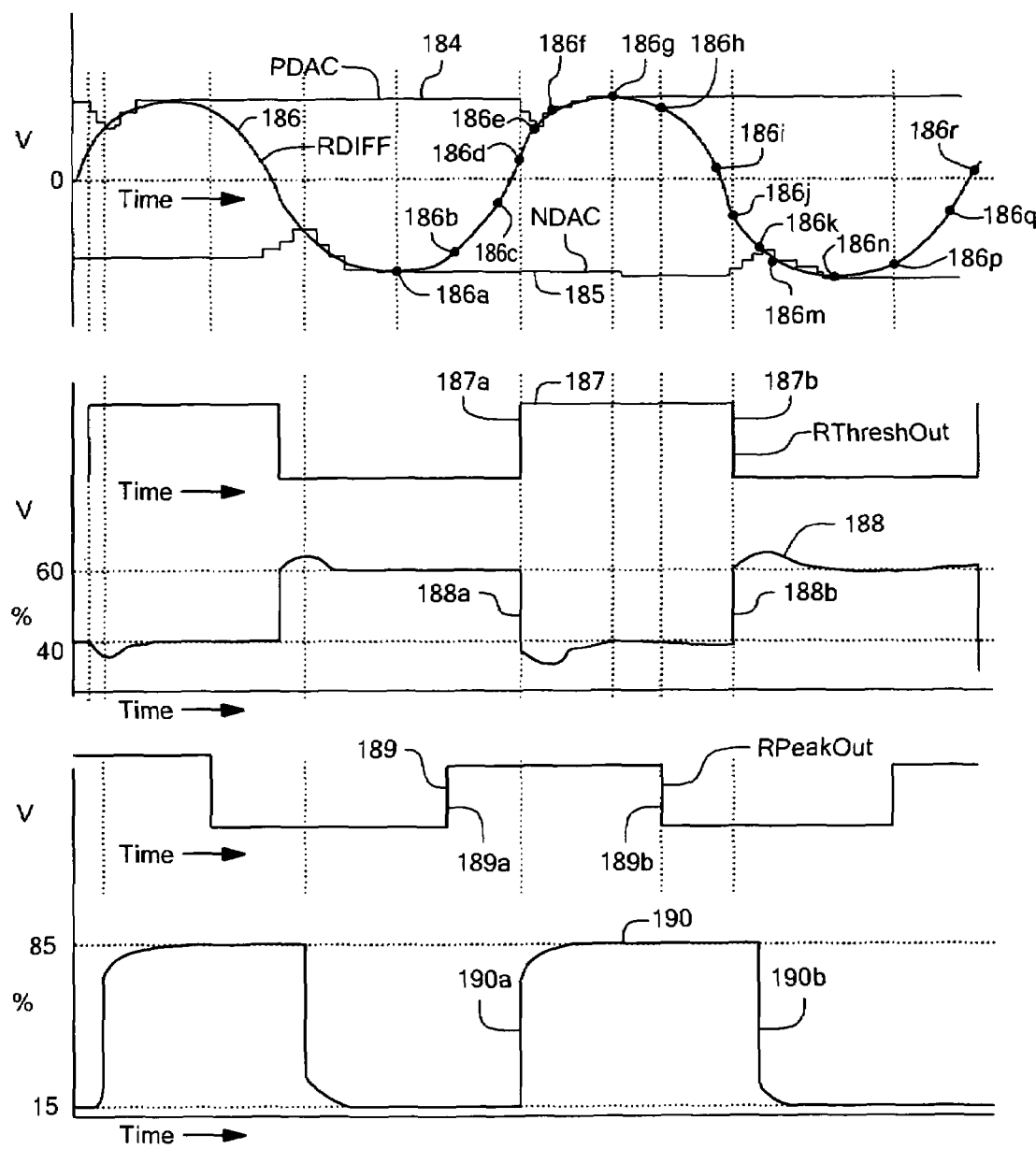
FIG. 2A shows a series of waveforms associated with the rotation detectors of FIG. 2.

Referring now to FIG. 2A, an RDIFF signal 186 can correspond, for example to the RDIFF signal 28 of FIG. 1 and the RDIFF signal 136 of FIG. 2. The RDIFF signal 186 is shown to have a shape of a simple sine wave for clarity. However, it will be recognized that the RDIFF signal 186 can have various shapes.

Two fill cycles of the RDIFF signal 186 are shown, however, relationships of the RDIFF signal 186 to other waveforms is described beginning at a point 186a. The point 186a and another point 186n each correspond to negative peaks of the RDIFF signal 186. Points 186b, 186m, 186p each correspond to the RDIFF signal 186 having reached about fifteen percent of its peak-to-peak amplitude. Points 186c, 186j, 186q each correspond to the RDIFF signal 186 having reached about forty percent of its peak-to-peak amplitude. Points 186d, 186i, 186r each correspond to the RDIFF signal 186 having reached about sixty percent of its peak-to-peak amplitude. Points 186f, 186h each correspond to the RDIFF signal 186 having reached about eighty five percent of its peak-to-peak amplitude. While particular percentages are described above, other percentages can also be used. However, the points 186b, 186e, 186h, 186k, and 186p will be seen to be associated with a peak-referenced detector, and therefore, are selected to be relatively near to a positive of a negative peak of the RDIFF signal 186.

A PDAC signal 184 corresponds to the PDAC output signal label in FIG. 2 and an NDAC signal 185 corresponds to the NDAC output signal label in FIG. 2. As seen in FIG. 2, the PDAC and NDAC output signals are applied to the resistor ladder 132, which can provide outputs at a variety of percentages of a difference between the PDAC output signal 184 and the NDAC output signal 185.

Presuming steady state conditions, at a time associated with the point 186a, the PDAC output signal 184 is at a steady state relatively high level corresponding to a positive peak of the RDIFF signal 186, where it remains until a time associated with the point 186d, corresponding to a sixty percent level. At this time, the PDAC output signal 184 counts down until the PDAC output signal 184 intersects the RDIFF signal 186 at the point 186e, at which point, the PDAC output signal 184 reverses direction and counts up to track the RDIFF signal 186 to its next positive peak at the point 186g. Upon reaching the point 186g, the PDAC output signal 184 again holds its value at the positive peak of the RDIFF signal 186.

At the point 186a, the NDAC output signal 185 is at a steady state relatively low level corresponding to a negative peak of the RDIFF signal 186, where it remains until a time associated with the point 186j, corresponding to a forty percent level. At this time, the NDAC output signal 185 counts up until the NDAC output signal 185 intersects the RDIFF signal 186 at the point 186k, at which point, the NDAC output signal 185 reverses direction and counts down to track the RDIFF signal 186 to its next negative peak at the point 186n. Upon reaching the point 186n, the NDAC output signal 185 again holds its value at the negative peak of the RDIFF signal 186. The above-described behavior of the PDAC signal 184 and the NDAC signal 185 repeats on each cycle of the RDIFF signal 186.

An RThreshOut signal 187 corresponds to the RThreshOut signal 26 of FIG. 1 and the RThreshOut signal 140 of FIG. 2. The RThreshOut signal 187 is a digital signal that, due to transitions of a threshold signal 188 described below, switches states at times corresponding to points 186d (sixty percent), 186j (forty percent), and 186r (sixty percent).

In order to achieve the desired edge time placement of the RThreshOut signal 187, a threshold signal 188 is generated, for example, the threshold signal 135 of FIG. 2 with the ladder network 132 of FIG. 2. As shown in FIG. 2 and as will be understood from the waveforms 184, 185, 186, 187, of FIG. 2A, using the RThreshOut signal 187 (140, FIG. 2) to control the transmission gate 133c of FIG. 2 and its inverse to control the transmission gate 133b, results in the threshold signal 188 (signal 135, FIG. 2). The resistor ladder 132 of FIG. 2 is scaled to provide transitions of the threshold 188 (signal 135, FIG. 2) between levels at about forty percent and about sixty percent of the peak-to-peak amplitude of the RDIFF signal 186 (signal 136, FIG. 2).

Taking edge 187a as representative of a positive edge in the RThreshOut signal 187 occurring at a time associated a the sixty percent point, e.g., the point 186d, it can be seen that the edge 187a is generally coincident with the downward edge 188a of the threshold signal 188. It will be understood that the transition 188a of the threshold 188 acts to provide hysteresis, for example, to the comparator 138 of FIG. 2. Following the edges 187a, 188a, which occur at the sixty percent point of the RDIFF signal 186, the next desired switch point is at the forty percent level of the RDIFF signal 186. Following the edges 187a, 188a, a switch point at the forty percent level does not occur until a time corresponding to the point 186j, where the RThreshOut signal 187 has transition 187b and the threshold signal 188 has transition 188b, again providing hysteresis.

It should be apparent that waveforms 187, 188 apply to a threshold detector, for example, a threshold detector associated with the RThresh comparator 138 of FIG. 2. Similar waveforms apply to a peak-referenced detector, for example a peak-referenced detector associated with the RPeak comparator 116 of FIG. 2. However, in order to generate an RPeakOut signal 189, different thresholds and timing are applied. The RPeakOut signal 189 corresponds, for example to the RPeakOut signal 24 of FIG. 1 and the RPeakOut signal 118 of FIG. 2. The RPeakOut signal 189 has an edge 189a associated with a point 186b at a fifteen percent level of the RDIFF signal and an edge 189b associated with a point 186b at an eight-five percent level of the RDIFF signal 138.

In order to achieve the desired edge time placement of the RPeakOut signal 189, a threshold signal 190 is generated, which corresponds, for example, to the threshold signal 134 of FIG. 2. As shown in FIG. 2 and as will be understood from the waveforms 184, 185, 186, 189, of FIG. 2A, the RPeakOut signal 190 (118, FIG. 2) is not used to directly control the transmission gates 133a, 133d of FIG. 2 to generate the threshold signal 190 (134, FIG. 2). This can be seen merely by the phase difference between the threshold signal 190 and the RPeakOut signal 189.

If the RPeakOut signal 189 were directly used to control the transmission gates 133a, 133b of FIG. 2, the threshold signal 190 would not behave as desired. For example, if the edge 189a at a time associated with the point 186b (a fifteen percent point) were used to generate a transition in the threshold 190, then the next eighty-five percent point 186f would be detected by the RPeak comparator 116 (FIG. 2). This is not the desired detection point. Instead it is desired that the point 186h be detected next, which is also an eighty-five percent point. It is desired that the eighty-five percent point be fifteen percent below and after the positive peak of the RDIFF signal 186 occurring at point 186g, as it is also desired that the fifteen percent point 186b be fifteen percent above and after the negative peak occurring at point 186a.

To generate the RPeakOut signal 189 having transitions associated with the proper fifteen percent and eighty-five percent points of the RDIFF waveform 186, for example, having the edges 189a, 189b associated with the points 186b, 186h, the threshold signal 190 has edges that do not align with the edges 189a, 189b of the RPeakOut signal 189. In one particular embodiment, the edges 190a, 190b align instead with the points 186e, 186k of the RDIFF signal 186. As described above, the point 186e corresponds to the point at which the PDAC output signal 184 intersect the RDIFF signal 186 as shown, and the point 186k corresponds to the point at which the NDAC output signal 185 intersects the RDIFF signal 186.

In order to generate the transitions 190a, 190b in the threshold 190, a control signal RPeakHyst (see FIG. 2) is generated to control the transmission gates 133a, 133d, having edges generally at the same times as the edges 190a, 190b. Generation of the RPeakHyst control signal is described in conjunction with FIG. 2B.

Figure 2B:
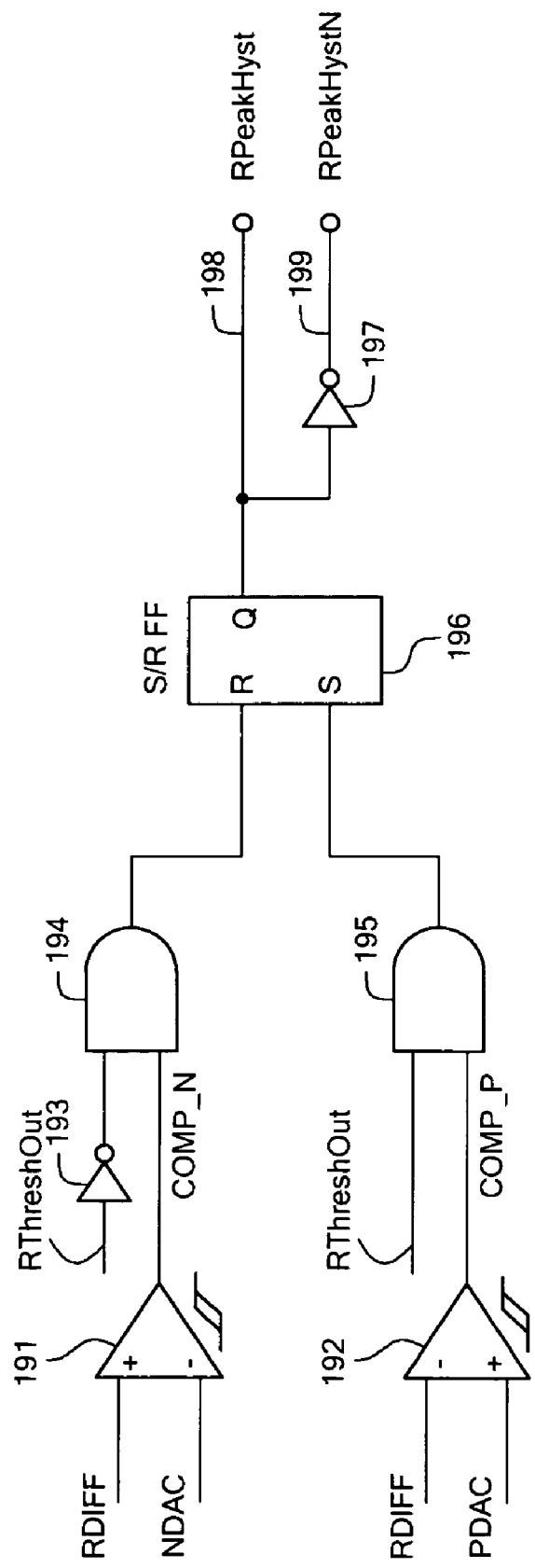
FIG. 2B is a block diagram of a circuit used to provide control signals to the rotation detectors of FIG. 2.

Referring now to FIG. 2B, a circuit can be used to provide the RPeakHyst signal described above in conjunction with FIG. 2A. As described above, the points 186e, 186k (FIG. 2A) are detected as the intersection of the PDAC signal 184 and the NDAC signal 185 respectively with the RDIFF signal 186. The detections can be accomplished with comparators 191, 192 to provide intermediate signals COMP_N and COMP_P, which are provided as inputs along with the RThreshOut signal (e.g., 140, FIG. 2, 187, FIG. 2A) to AND gates 194, 195. Outputs of the AND gates 194, 195 are used to control a set/reset flip-flop 196, generating the RPeakHyst signal 198. An inverter 197 can be used to provide an inverted signal RPeakHystN. The RPeakHyst and RPeakHystN signals 198, 199 have edges coincident with the edges 190a, 190b of the threshold signal 190 (FIG. 2A), and are used to control the transmission gates 133a, 133d respectively of FIG. 2.

From the above description, it should be apparent that the peak-referenced detectors (e.g., 20, 54 of FIG. 1) differ from conventional peak-referenced detectors in that, whereas conventional peak-referenced detectors use thresholds that are a fixed voltage above the negative peak of a DIFF signal and a fixed voltage below the positive peak of the DIFF signal, the peak-referenced detector described above uses thresholds that are a percentage above the negative peak of the DIFF signal and a percentage below a positive peak or the DIFF signal.

While FIGS. 2A and 2B describe a peak-referenced detector using thresholds that are different than thresholds used in a conventional peak-referenced detector, in other embodiments, conventional peak-referenced detectors can be used with this invention. For example, the peak-referenced detectors 20, 54 can be conventional peak-referenced detectors using thresholds that are a fixed voltage above negative peaks of the RDIFF signals 28, 58 respectively and a fixed voltage below positive peaks of the RDIFF signals 28, 58.

Figure 3A:
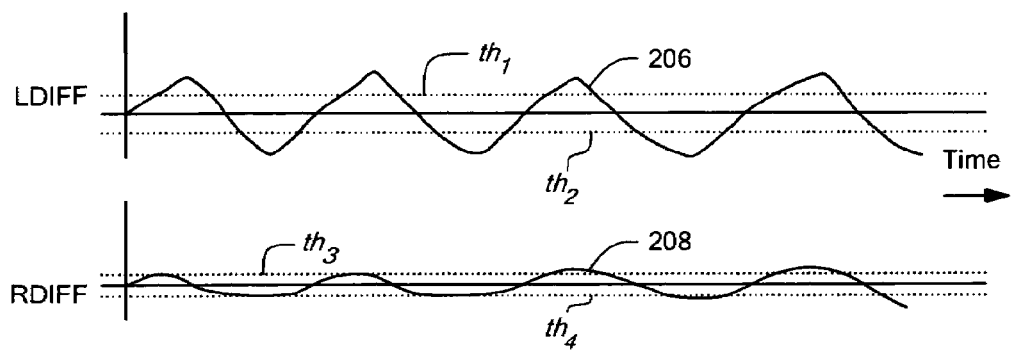
Figure 3B:
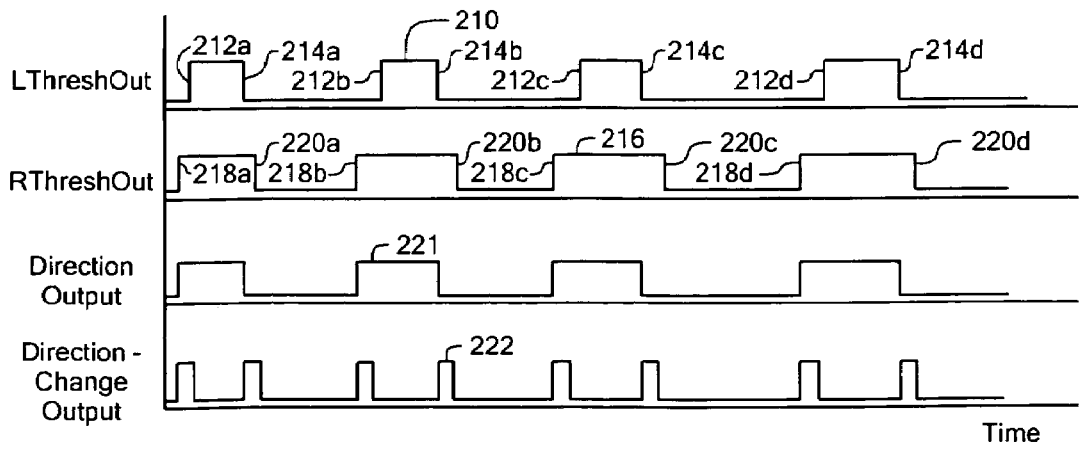

Referring now to FIGS. 3-3B, waveforms are shown which are associated with the threshold direction-change processor 36 of FIG. 1 in response to a rotational vibration. However, the waveforms can also be associated with the peak direction-change processor 30 of FIG. 1.

Referring first to FIG. 3, waveforms 202 and 204, shown by phantom lines, represent magnetic fields experienced by the sensor 10 of FIG. 1 if the sensor 10 were in proximity, for example, to a rotating ferrous gear continuously rotating in normal operation. Portions 202a, 204a of the magnetic field signals 202, 204, however, are representative of magnetic fields that would be experienced by the sensor 10 in response to a rotational vibration of the ferrous gear. More particularly, the magnetic field signal 202a is representative of the magnetic field experienced by the magnetic field sensors 14a, 14b (FIG. 1) and the magnetic field signal 204a is representative of the magnetic field experienced by the magnetic field sensors 14b, 14c (FIG. 1) in response to the rotational vibration.

A complete cycle of the magnetic fields 202, 204 corresponds to one tooth of the ferrous gear passing by the sensor 10, which generally corresponds to only a small portion of a complete revolution of the ferrous gear. The magnetic field signals 202a and 204a associated with the rotational vibration are bounded by a region between phases $\phi 1$ and $\phi 2$. The region between phases $\phi 1$ and $\phi 2$, therefore, corresponds to an even smaller portion of a complete rotation of the ferrous gear.

While shown in one position on a time scale, the region between phases $\phi 1$ and $\phi 2$ can be at any position on the time scale. Furthermore, it will be appreciated that the phases $\phi 1$ and $\phi 2$ can have any separation. A larger separation corresponds to a larger magnitude rotational vibration and a smaller separation corresponds to a smaller magnitude rotational vibration.

While the magnetic fields 202, 204 have a frequency associated with the rotation of the ferrous gear in normal operation, it should be appreciated that the magnetic fields 202a, 204a can be experienced at any frequency by the sensor 10 (FIG. 1), determined by a rate of rotational vibration. The ferrous gear rotating back and forth about its axis of rotation causes the sensor 10 to experience the magnetic fields 202a, 204a at the frequency of the rotational vibration.

Referring now to FIG. 3A, the sensor 10 generates an LDIFF signal 206 and an RDIFF signal 208. The LDIFF signal 206 corresponds, for example, to the LDIFF signals 58, 158 shown in FIGS. 1 and 2 respectively, and the RDIFF signal 208, corresponds, for example, to the RDIFF signals 28, 136 of FIGS. 1 and 2 respectively. It will be apparent from the magnetic fields 202a, 204a shown in FIG. 3, that the LDIFF signal 206 can have a greater magnitude than the RDIFF signal 208. However if the region bounded by $\phi 1$ and $\phi 2$ (FIG. 3) were to be at a different position along the time scale in FIG. 3, it is equally possible for the LDIFF signal 206 and the RDIFF signal 208 to have other magnitude relationships. In response to a vibration, the LDIFF signal 206 and the RDIFF signal 208 are approximately in phase.

The LDIFF signal 206 and the RDIFF signal 208 can have different wave shapes depending, for example, on slopes in the region bounded by $\phi 1$ and $\phi 2$ of FIG. 3, and on the nature of the vibration. As shown, the LDIFF signal 206 has a substantially triangular shape whereas the RDIFF signal 208 has a substantially sinusoidal shape.

Furthermore, as described above, the region bounded by $\phi 1$ and $\phi 2$ (FIG. 3) can be at any position and have any separation relative to the magnetic field signals 202, 204. Furthermore, the rotational vibration associated with the region bounded by $\phi 1$ and $\phi 2$ can have any type of movement. Therefore, it should be recognized that the LDIFF signal 206 and the RDIFF signal 208 can be more complex waveforms than those shown.

In operation, the LDIFF signal 206 is compared to thresholds th1 and th2 and the RDIFF signal 208 and is compared to thresholds th3 and th4. The thresholds th1, th2 correspond to two states of the threshold 135 of FIG. 2 and the thresholds th3, th4 correspond to two states of a threshold 178 of FIG. 2.

Referring now to FIG. 3B, comparison of the LDIFF signal to the thresholds th1 and th2 shown in FIG. 3A results in an LThreshOut signal 210 and comparison of the RDIFF signal 208 to the thresholds th3 and th4 of FIG. 3A results in an RThreshOut signal 216. The LThreshOut signal 210 corresponds to the LThreshOut signals 62, 182 of FIGS. 1 and 2 respectively and the RThreshOut signal 216 corresponds to the RThreshOut signal 26, 140 of FIGS. 1 and 2 respectively. Because the LDIFF signal 206 is larger than and has a different shape than the RDIFF signal 208, the LThreshOut signal 210 has a positive state duty cycle less than the RThreshOut signal 216.

As described above, in an alternate embodiment, the signals of FIGS. 3-3B can be associated with the peak-referenced detectors 20, 54 of FIG. 1, in which case, the thresholds th1-th4 are selected in accordance with the left channel peak-referenced detector 54 and the right channel peak-referenced detector 20 of FIG. 1, and the LThreshOut signal 210 and an RThreshOut signal 216 are instead an LPeakOut signal (not shown) and an RPeakOut signal (not shown) corresponding to the LPeakOut signal 60, 162 and an RPeakOut signal 24, 116 of FIGS. 1 and 2 respectively.

The LThreshOut signal 210 has rising edges 212a-212d and falling edges 214a-214d and the RThreshOut signal 216 has rising edges 218a-218d and falling edges 220a-220d. In operation, the threshold direction-change processor 36 (FIG. 1) compares the LThreshOut signal 210 to the RThreshOut signal 216 to detect leading rising and leading falling edges. Detection of the leading rising and falling edges of the LThreshOut signal 210 and the RThreshOut signal 216 results in a direction output signal 221 having a state indicative of a direction of rotation. For example, the falling edge 220a of the right channel leads the falling edge 214a of the left channel, resulting in a high level in the direction output signal 221. Also, the rising edge 218b of the right channel lags the rising edge 212b of the left channel, resulting in a low level in the direction output signal 221. A leading edge in the LThreshOut signal 214 results in a first logic state of the direction output signal 221, and a leading edge in the RThreshOut signal 216 results in an opposite logic state. Therefore, in response to rotational vibration of the ferrous gear, the direction output signal 221 changes state. A direction-change output signal 222 can be generated to provide a pulse at each edge of the direction output signal 221. Generation of the direction-change output signal 222 is further described in conjunction with FIGS. 8 and 8A.

The direction-change output signal 222 corresponds either to the direction-change output signal 38 of FIG. 1 or the to the direction-change output signal 32 of FIG. 1, depending upon whether the thresholds th1-th4 are selected in accordance with the threshold detectors 22, 56 of FIG. 1, or with the peak reference detectors 20, 54 of FIG. 1. It will become more apparent from the discussion below in conjunction with FIGS. 4-4B that a direction-change output signal 222 that changes state as shown is indicative of a rotational vibration and a direction-change output signal 222 that does not change state is indicative of no rotation direction change, i.e., of a unidirectional rotation in normal operation. Therefore, a vibration can be detected.

It should be recognized that the waveforms shown in FIG. 3-3C represent one example of possible waveforms associated with a vibration. For example, other waveforms can be shown to occur in the presence of a vibration for which the LDIFF signal 206 and the RDIFF signal 208 are closely matched in shape and amplitude, which in turn results in the LThreshOut signal 210 and the RThreshOut signal 216 being closely matched. However, even in this case, due to electrical noise present on the LDIFF and RDIFF signals 206, 208, the LThreshOut signal 210 and the RThreshOut signal 216 can have leading edges that jitter in time resulting in a toggling direction-change output signal 222 and detection of the vibration. However, it is also possible that the LDIFF signal 206 and the RDIFF signal 210 can have waveform shapes resulting in no detection of a vibration. In this case, any one of the other vibration detectors 30, 36, 40, and 46 (FIG. 1) can detect the vibration.

Referring now to FIGS. 4-4B in which like elements of FIGS. 3-3B are shown having like reference designations, waveforms are shown that are associated with the threshold direction-change processor 36 of FIG. 1 in response to a rotation in normal operation. Referring first to FIG. 4, magnetic field signals 252 and 254 are representative of magnetic fields that would be experienced by the sensor 10 of FIG. 1 if the sensor 10 were in proximity, for example, to a rotating ferrous gear continuously rotating in one direction in normal operation. More particularly, the magnetic field signal 252 is representative of the magnetic field experienced by the magnetic field sensors 14a, 14b (FIG. 1) and the magnetic field signal 254 is representative of the magnetic field experienced by the magnetic field sensors 14b, 14c (FIG. 1) in response to the rotation in normal operation.

A complete cycle of the magnetic fields 252, 254 corresponds to one tooth of the ferrous gear passing by the sensor 10, which generally corresponds to only a small portion of a complete revolution of the ferrous gear.

Referring now to FIG. 4A, the sensor 10 generates an LDIFF signal 256 and an RDIFF signal 258. The LDIFF signal 256 corresponds, for example, to the LDIFF signals 58, 158 shown in FIGS. 1 and 2 respectively, and the RDIFF signal 258, corresponds, for example, to the RDIFF signals 28, 136 of FIGS. 1 and 2 respectively. It will be apparent from the magnetic fields 252, 254 shown in FIG. 4, that the LDIFF signal 256 has about the same magnitude as the RDIFF signal 258.

The LDIFF signal 256 and the RDIFF signal 258 are out of phase by an amount proportional to a variety of factors, including but not limited to a separation between gear teeth on the ferrous gear and a separation between the magnetic field sensors, i.e., a separation between the magnetic field sensors 14a, 14b (FIG. 1) and the magnetic field sensors 14b, 14c (FIG. 1). In one particular embodiment, the ferrous gear rotates at approximately 1000 rpm, has gear teeth that are separated by approximately ten millimeters, and a center between the magnetic field sensors 14a, 14b is separated from a center between the magnetic field sensors 14b, 14c by approximately 1.5 millimeters. With this particular arrangement, the LDIFF signal 256 and the RDIFF signal 258 differ in phase by approximately forty degrees.

As described above, in operation, thresholds th1 and th2 are applied to the LDIFF signal 256 and thresholds th3 and th4 are applied to the RDIFF signal 258. The thresholds th1-th4 are described above in conjunction with FIG. 3A.

Referring now to FIG. 4B, application of the thresholds th1-th4 shown in FIG. 4A result in an LThreshOut signal 260 and an RThreshOut signal 266. Because the LDIFF signal 256 is about the same magnitude as the RDIFF signal 258 but at a different relative phase, the LThreshOut signal 260 has a duty cycle similar to that of the RThreshOut signal 266, but at the different relative phase.

The LThreshOut signal 260 has rising edges 262a-262b and falling edge 264a and the RThreshOut signal 266 has rising edges 268a-268b and falling edge 270a. In operation, the LThreshOut signal 260 is compared by the threshold direction-change processor 36 (FIG. 1) to the RThreshOut signal 266 to detect leading rising and leading falling edges. Detection of the leading rising and falling edges of the LThreshOut signal 260 and the RThreshOut signal 266 results in a direction output signal 271 indicative of a direction of rotation. For example, the falling edge 264a of the left channel leads the falling edge 270a of the right channel, resulting in a low level in the direction output signal 271. Also, the rising edge 262b of the left channel leads the rising edge 268b of the right channel, resulting again in a low level in the direction output signal 271. A direction-change output signal 272 can be generated to provide a pulse at each edge of the direction output signal 271. Therefore, in response to rotation of the ferrous gear in normal operation, the direction-change output signal 272 remains at one state.

The direction-change output signal 272 corresponds either to the direction-change output signal 38 of FIG. 1 or the direction-change output signal 32 of FIG. 1, depending upon whether the thresholds th1-th4 are in accordance with the threshold detectors 22, 56 of FIG. 1, or with the peak-referenced detectors 20, 54 of FIG. 1.

From FIGS. 3-3B and 4-4B it should be apparent that the direction-change output signal 222 and the direction-change output signal 272, both of which correspond to the direction-change output signal 38 of FIG. 1 or the direction-change output signal 32 of FIG. 1, can provide an indication of whether the ferrous gear is experiencing rotational vibration or is rotating in normal operation. Therefore, rotational vibration can be detected.

Referring now to FIG. 5, waveforms are shown that are associated with the direction-agreement processor 40 of FIG. 1. Portions of magnetic field signals 302, 304 from zero to four on a time scale are representative of magnetic fields that would be experienced by the sensor 10 of FIG. 1 if the sensor 10 were in proximity, for example, to a rotating ferrous gear experiencing rotational vibration. Other portions of the magnetic field signals 302, 304 from four to six on the time scale are representative of magnetic fields that would be experienced by the sensor 10 in response to a continuous unidirectional rotation of the ferrous gear in normal operation. It can be seen that neither the portions of the waveforms 302, 304 between zero and four nor the portions between four and six are necessarily pure sine waves.

Neither LDIFF and RDIFF signals nor thresholds corresponding to the thresholds th1-th4 of FIGS. 3A and 4A are shown. However, LDIFF and RDIFF signals (not shown) are generated and are compared to thresholds as described in conjunction with FIGS. 3B and 4B, for example, in association with the left channel threshold detector 56 and the right channel threshold detector 22 of FIG. 1, to generate an LThreshOut signal 306 and an RThreshOut signal 308 corresponding to the LThreshOut signal 62 and the RThreshOut signal 26 of FIG. 1. As described above in conjunction with FIGS. 3-3B, the thresholds correspond to the thresholds 135, 178 of FIG. 2, each of which can have two values.

Other thresholds are also applied to the LDIFF signal (not shown) and to the RDIFF signal (not shown), for example, by the left channel peak-referenced detector 54 and the right channel peak-referenced detector 20 of FIG. 1 to generate an LPeakOut signal 310 and an RPeakOut signal 312 corresponding to the LPeakOut signal 60 and the RPeakOut signal 24 of FIG. 1. These other thresholds can correspond, for example to the thresholds 134, 176 of FIG. 2, each of which can have two values.

In operation, the LThreshOut signal 306 is compared with the RThreshOut signal 308 by the direction-agreement processor 40 (FIG. 1) to provide an output signal ThreshDirOut 314 indicative of which signal, LThreshOut or RThreshOut, has leading edges. As shown, during the time from zero to four on the time scale, corresponding to a rotational vibration of the ferrous gear, both the rising and falling edges of the LThreshOut signal 306 lead the rising and falling edges of the RThreshOut signal 308. The same relationship applies during the time from four to six on the time scale, corresponding to normal unidirectional rotation of the ferrous gear. Having a continuous leading edge relationship, regardless of whether the ferrous gear is experiencing rotational vibration or a rotation in normal operation, results in a ThreshDirOut signal 314 that does not change state.

Furthermore, in operation, the LPeakOut signal 310 is compared with the RPeakOut signal 312 to provide an output signal PeakDirOut 316 indicative of which signal, LPeakOut or RPeakOut, has leading edges. As shown, during the time from zero to four on the time scale, corresponding to a rotational vibration of the ferrous gear, both the rising and falling edges of the LPeakOut signal 310 lag the rising and falling edges of the RPeakOut signal 312. The opposite relationship applies during the time from four to six on the time scale, corresponding to a normal rotation of the ferrous gear, where both the rising and falling edges of the LPeakOut signal 310 lead the rising and falling edges of the RPeakOut signal 312. Having opposite relationships at times when the ferrous gear is experiencing rotational vibration as compared to times when the ferrous gear is experiencing rotation in normal operation results in a PeakDirOut signal 316, which changes state at time four (e.g., PeakDirOut 316 is in a high state between the times zero to four and in a low state between the times four to six).

It should be recognized that the state of the ThreshDirOut signal 314 and the state of the PeakDirOut signal 316 are associated with a direction of rotation of the ferrous gear. Therefore, in the time period from zero to four, the ThreshDirOut signal 314 and the PeakDirOut signal 316 having different directions of rotation (i.e., they do not agree) and in the time period from four to six they indicate the same direction of rotation (i.e., they agree). Therefore, an agreement (i.e., the ThreshDirOut signal 314 and the PeakDirOut 316 having the same state) provides an indication of a rotation in normal operation and a disagreement (i.e., the ThreshDirOut signal 314 and the PeakDirOut 316 having different states) provides an indication of a rotational vibration.

The ThreshDirOut signal 314 and the PeakDirOut signal 316 are combined to provide a direction-agreement output signal 318 corresponding, for example, to the direction-agreement output signal 42 of FIG. 1, which provides an indication of whether the ferrous gear is experiencing rotational vibration or is rotating in normal operation. Therefore, a vibration can be detected.

Referring now to FIG. 6, waveforms 352, 354 are shown, which are associated with the phase-overlap processor 46 of FIG. 1. The waveforms 352, 354 are representative of magnetic fields that would be experienced by the sensor 10 of FIG. 1 if the sensor 10 were in proximity, for example, to a rotating ferrous gear continuously rotating in normal operation. More particularly, the waveform 352 is representative of the magnetic field experienced by the magnetic field sensors 14a, 14b (FIG. 1) and the magnetic field signal 354 is representative of the magnetic field experienced by the magnetic field sensors 14b, 14c (FIG. 1) in response to a rotation in normal operation.

As described above in conjunction with FIG. 4, in normal operation, because of a separation between magnetic field sensors, the magnetic field experienced by the magnetic field sensors 14a, 14b (i.e., waveform 352) is generally out of phase from the magnetic field experienced by the magnetic field sensors 14b, 14c (i.e., waveform 354). For example, in one particular embodiment described above in conjunction with FIG. 4, the waveforms 352, 354 are out of phase by about forty degrees.

First signal regions 356a, 356b are selected to be a first predetermined percentage range of the peak-to-peak amplitude of the waveform 352. Second signal regions 358a, 358b are similarly selected to be the first predetermined percentage range of the peak-to-peak amplitude of the waveform 354. In one particular embodiment, the first predetermined percentage range is seventy percent to eighty-five percent.

Third signal regions 360a, 360b are selected to be a second predetermined percentage range of the peak-to-peak amplitude of the waveform 352. Fourth signal regions 362a, 362b are similarly selected to be the second predetermined percentage range of the peak-to-peak amplitude of the waveform 354. In one particular embodiment, the second predetermined percentage range is fifteen percent to thirty percent.

The first and second predetermined percentage ranges are selected so that the first signal regions 356a, 356b do not overlap the second signal regions 358a, 358b and the third signal regions 360a, 360b do not overlap the fourth signal regions 362a, 363b, when the ferrous gear is rotating in normal operation.

Referring now to FIG. 7, waveforms 402, 404 are shown, which are associated with the phase-overlap processor 46 of FIG. 1. The waveforms 402, 404 are an RDIFF signal 402 and an LDIFF signal 404, which are representative of magnetic fields that would be experienced by the sensor 10 of FIG. 1 if the sensor 10 were in proximity, for example, to a rotating ferrous gear experiencing translational vibration. More particularly, the waveform 402 is representative of the magnetic field experienced by the magnetic field sensors 14a, 14b (FIG. 1) and the magnetic field signal 404 is representative of the magnetic field experienced by the magnetic field sensors 14b, 14c (FIG. 1) in response to the translational vibration.

As described above in conjunction with FIG. 6, when the ferrous gear is rotating in normal operation, magnetic fields experienced by the magnetic field sensors will be out of phase due to separation of the magnetic field sensors. However, as shown in FIG. 7, when experiencing translational or rotational vibration, even with the separation of the magnetic field sensors, the magnetic fields experienced are generally in phase (but can also be one hundred eighty degrees out of phase). Therefore, in the same way as the first, second, third and fourth signal regions 356a-356b, 358a-358b, 360a-360b, 362a-362b are described in conjunction with FIG. 6, first and third signal regions 406a-406e and 408a-408d respectively can be associated with the waveform 402 and second and fourth signal regions 410a-410e and 412a-412d respectively can be associated with the waveform 404. Because the waveforms 402, 404 are essentially in phase, the first signal regions 406a-406e of the waveform 402 overlap the second signal regions 410a-410e of the waveform 404 in time and the third signal regions 408a-408d of the waveform 402 overlap the fourth signal regions 412a-412d of the waveform 404 in time.

If the signals 402, 404 were one hundred eighty degrees out of phase as described above, it is also possible that the first and fourth signal regions could overlap, for example, the first signal region 406a and fourth signal region 412a. Also the second and third signal regions could overlap, for example, the second signal region 410a and the third signal region 408a.

A high state of a phase flag signal 420 (phase_flag_l) indicates times during which the LDIFF signal 404 is within the regions 410a-410e and 412a-412d, and a high state of a phase flag signal 422 (phase_flag_r) corresponds to times during which the RDIFF signal 402 is within the regions 406a-406e and 408a-408d. A left-right coincident signal 424 (lr_coincident) corresponds to an overlap of the phase flag signals 420, 422 being in a high state (i.e., an AND function is applied).

Therefore, the left-right coincident signal 420 provides an indication of a translational or rotational vibration. The left-right coincident signal 420 can correspond, for example, to the phase-overlap output signal 48 of FIG. 1, which can provide an indication of whether the ferrous gear is experiencing translational vibration or is rotating in normal operation. Therefore, a vibration can be detected.

Each of the direction-change output signal (e.g., 38 and/or 32, FIG. 1), the direction-agreement output signal (e.g., 42, FIG. 1), and the phase-overlap output signal (e.g., 48, FIG. 1) can provide information regarding vibration of the ferrous object, and the output signals 32, 38, 41, 48 can be used individually or in any combination of two, three, or four output signals to provide an indication of a vibration. To this end, the combining processor 34 (FIG. 1), is responsive to two or more of the vibration processor output signals 32, 38, 42, 48 for generating the vibration-decision output signal 80.

FIGS. 8-10 and 14-14A show flowcharts illustrating techniques, which would be implemented in an electronic device or in a computer processor. Rectangular elements (typified by element 452 in FIG. 8), herein denoted "processing blocks," can represent computer software instructions or groups of instructions. Diamond shaped elements, herein denoted "decision blocks," can represent computer software instructions, or groups of instructions that affect the execution of the computer software instructions represented by the processing blocks.

Alternatively, the processing and decision blocks represent steps performed by functionally equivalent circuits, such as a digital signal processor circuit or application specific integrated circuit (ASIC), or discrete electrical components. The flow diagrams do not depict the syntax of any particular programming language. Rather, the flow diagrams illustrate the functional information one of ordinary skill in the art requires to fabricate circuits or to generate computer software to perform the processing required of the particular apparatus. It will be appreciated by those of ordinary skill in the art that unless otherwise indicated herein, the particular sequence of blocks described is illustrative only and can be varied without departing from the spirit of the invention. Thus, unless otherwise stated, the blocks described below are unordered meaning that, when possible, the steps can be performed in any convenient or desirable order.

Referring now to FIG. 8, a process 450 of generating a direction-change output signal (e.g., signal 38, FIG. 1) begins at block 452, where a first rotation detector provides an output signal. In one illustrative embodiment, the first rotation detector is the left channel threshold detector 56 of FIG. 1 having the output signal 62 (LThreshOut) of FIG. 1. At block 454, a second rotation detector provides an output signal. In one illustrative embodiment, the second rotation detector is the right channel threshold detector 22 of FIG. 1 having the output signal 26 (RThreshOut) of FIG. 1.

At block 456, a change in direction of rotation is identified from the output signals provided by the first and second rotation detectors. The identification can be provided, for example, by the process 500 described in conjunction with FIGS. 8A and 8B.

At block 458, a direction-change output signal is generated in response to the change of direction identified at block 456. For example, the direction-change output signal can be the direction-change output signal 38 of FIG. 1. In one particular embodiment, the direction-change output signal can be a simple signal state. For example, the direction-change output signal can be high when a direction change is identified at block 456 and low when no direction change is identified at block 456. In other embodiments, the direction-change output signal can be encoded to indicate a direction change or a lack of direction change.

Figure 8B:
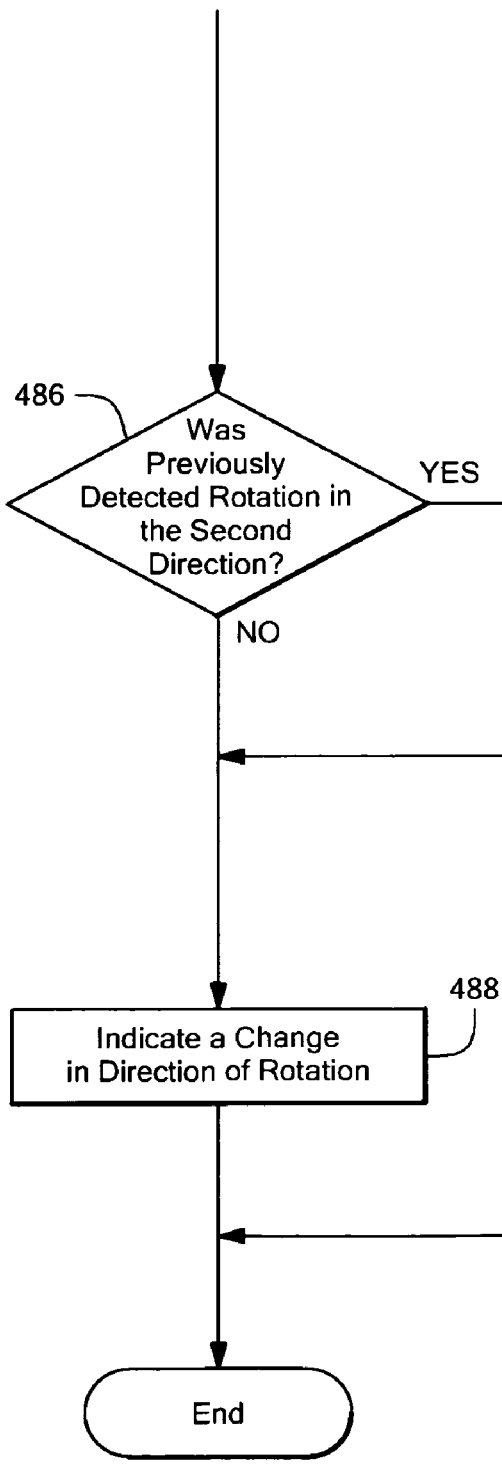
Figure 8B:
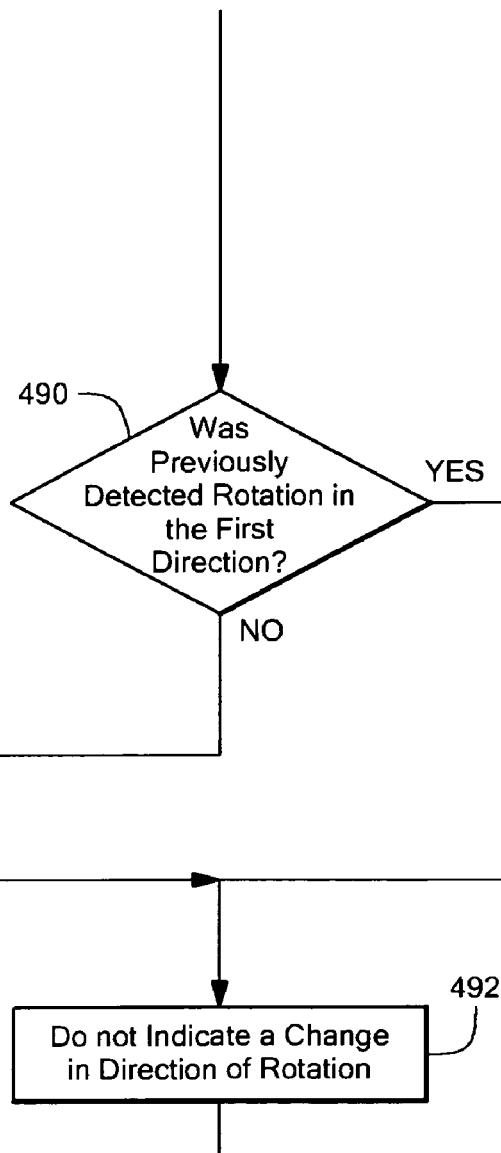

Referring now to FIGS. 8A and 8B, an exemplary process 470 can be used to identify a direction change associated with a rotation of the ferrous object corresponding to block 456 of FIG. 8. At block 472, if a rising or a falling edge is detected in either the output signal from the first rotation detector or in the output signal from the second rotation detector, the process proceeds to step 474. If no edge is detected, the process loops at block 472. As noted above, in one illustrative embodiment, the first rotation detector is the left channel threshold detector 56 of FIG. 1 having the output signal 62 (LThreshOut), and the second rotation detector is the right channel threshold detector 22 of FIG. 1 having the output signal 26 (RThreshOut).

If an edge is detected, at block 474 it is determined whether the edge detected at block 472 was a rising edge in the output signal from the first rotation detector and the output signal from the second rotation detector was low at the time of the rising edge from the first rotation detector. If this condition is met, the process proceeds to block 484, where it is deemed that the rotation is in a first direction. If this condition is not met, then the process proceeds to block 476.

At block 476, it is determined whether the edge detected at block 472 was a rising edge in the output signal from the second rotation detector and the output signal from the first rotation detector was low at the time of the rising edge from the second rotation detector. If this condition is met, the process proceeds to block 484, where it is deemed that the rotation is in the first direction. If this condition is not met, then the process proceeds to block 478.

At block 478, it is determined whether the edge detected at block 472 was a falling edge in the output signal from the first rotation detector and the output signal from the second rotation detector was high at the time of the falling edge from the first rotation detector. If this condition is met, the process proceeds to block 484, where it is deemed that the rotation is in the first direction. If this condition is not met, then the process proceeds to block 480.

At block 480, it is determined whether the edge detected at block 472 was a falling edge in the output signal from the second rotation detector and the output signal from the first rotation detector was high at the time of the falling edge from the second rotation detector. If this condition is met, the process proceeds to block 484, where it is deemed that the rotation is in a first direction. If this condition is not met, the process continues to block 482 where it is deemed that the rotation is in a second direction.

From block 482, the process proceeds to decision block 486, where it is determined if the previously detected rotation was in the second direction. If the previously detected rotation was not in the second direction, then at block 488, the process 470 indicates a change in direction of rotation.

From block 484, the process proceeds to decision block 490, where it is determined if the previously detected rotation was in the first direction. If the previously detected rotation was not in the first direction, then at block 488, the process 470 indicates a change in direction of rotation.

If at decision block 486, the previously detected rotation was in the second direction, or if at decision block 490, the previously detected rotation was in the first direction, then at block 492, the process 470 indicated no change in direction of rotation.

It should be apparent that the conditions of blocks 474-480 correspond to edges 212, 214, 218, 220 described in conjunction with FIG. 3B.

Referring now to FIG. 9, a process 500 of generating a direction-agreement output signal (e.g., 42, signal FIG. 1) begins at block 502, where a first direction of rotation is detected. In one embodiment, the first direction of rotation is associated with the left channel threshold detector 56 and the right channel threshold detector 22 of FIG. 1. Direction of rotation can be detected by the process shown in FIGS. 8A and 8B.

At block 504, a second direction of rotation is detected. In the illustrative embodiment, the second direction of rotation is associated with the left channel peak-referenced detector 54 and the right channel peak-referenced detector 20 of FIG. 1. Again, direction of rotation can be detected by a process such as the process shown in FIGS. 8A and 8B.

At block 506, it is determined if the first and second directions of rotation identified at blocks 502 and 504 respectively agree with each other. If the directions do not agree, at step 508, a direction-agreement output signal is generated that indicates a vibration of the ferrous gear. If the directions do agree, at step 508 a direction-agreement output signal is generated that indicates rotation in normal operation. The direction-agreement output signal can correspond, for example, to the direction-agreement output signal 42 of FIG. 1.

Referring now to FIG. 10, a process 550 of generating a phase-overlap output signal (e.g., signal 42, FIG. 1) begins at block 552, where a magnetic field is detected at a first location relative to the ferrous object to provide an LDIFF signal. The first location can correspond, for example to a location of a center between the magnetic field sensors 14b, 14c of FIG. 1, and the LDIFF signal corresponds to the LDIFF signal 58 of FIG. 1 or the LDIFF signal 158 of FIG. 2.

At block 554, a magnetic field is detected at a second location to provide an RDIFF signal. The second location can correspond, for example, to a location of a center between the magnetic field sensors 14a, 14b of FIG. 1, and the RDIFF signal corresponds to the RDIFF signal 28 of FIG. 1 or the RDIFF signal 136 of FIG. 2.

At block 556, a first signal region is identified, which is associated with the RDIFF signal and a second signal region is identified, which is associated with the LDIFF signal. The first signal region can correspond, for example, to the first signal regions 356a, 356b of FIG. 6 and the second signal region can correspond, for example, to the second signal regions 358a, 358b of FIG. 6.

While first and second signal regions are described above in conjunction with block 556, it should be understood that in an alternate arrangement, third and fourth signal regions can also be used, for example the third signal regions 360a, 360b and the fourth signal regions 362a, 362b of FIG. 6. The third and fourth signal regions can be used in place of, or in addition to, the first and second signal regions.

At block 558, an overlap or lack of overlap of the first and second signal regions is identified. In the alternate arrangement described above, an overlap or lack of overlap of the third and fourth signal regions can also be identified. In still other arrangements, an overlap or lack of overlap of the first and fourth signal regions and/or the second and third signal regions is also identified.

At block 560, if an overlap of the first and second regions is identified at block 558 (and/or an overlap of the third and fourth signal regions), a phase-overlap output signal is generated representative of a vibration of the ferrous gear. If a lack of overlap of the first and second signal regions is identified at block 558 (and/or a lack of overlap of the third and fourth signal regions) then the phase-overlap output signal is generated representative of a rotation of the ferrous gear in normal operation. The phase-overlap output signal can correspond, for example, to the phase-overlap output signal 48 of FIG. 1.

Based upon the vibration detections indicated by the combining processor 34 of FIG. 1, calibrations associated with the right channel offset control 106, the right channel offset DAC 108, a left channel offset control 144, a left channel offset DAC 146, and the shared AGC DAC 152, all shown in FIG. 2, can be avoided while a vibration is detected.

Figure 11:
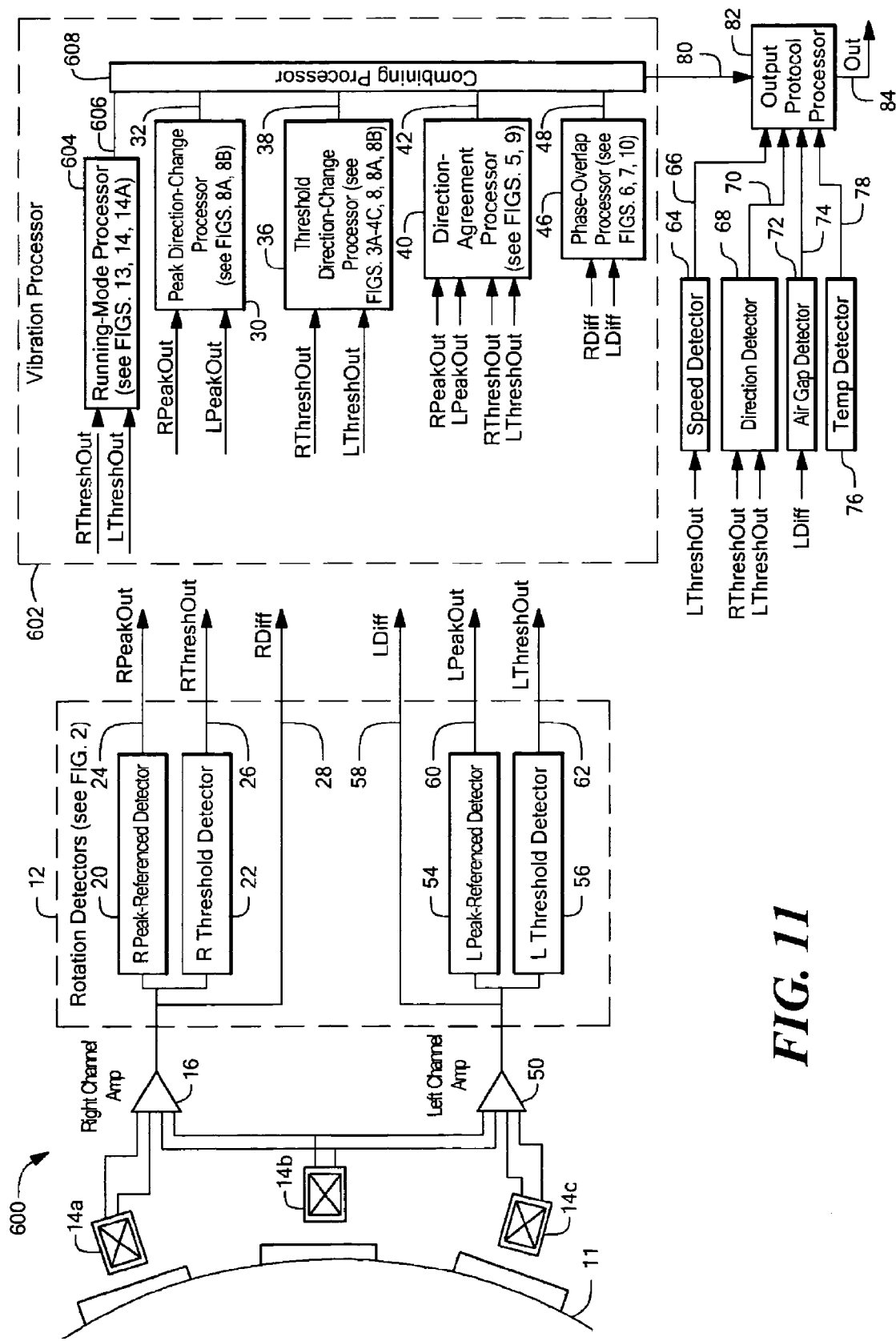
FIG. 11 is a block diagram of an alternate sensor containing a vibration processor according to the invention.

Referring now to FIG. 11, in which like elements of FIG. 1 are shown having like reference designations, an exemplary sensor 600 includes a vibration processor 602. The vibration processor 602 is similar to the vibration processor 13 of FIG. 1, however, the vibration processor 602 includes a running-mode processor 604 to provide a running-mode-vibration output signal 606 to a combining processor 608. The combining processor 608 is similar to the combining processor 34 of FIG. 1, however, the combining processor 608 has an additional input to receive the running-mode-vibration output signal 606.

The running-mode processor 604 can be but one processor within the vibration processor 602 capable of detecting a vibration. For example, the running-mode-vibration output signal 606 can be combined with outputs 32, 38, 42, 48 from others of the processors 30, 36, 40, 46 described above in conjunction with FIG. 1, each capable of detecting a vibration. The combining processor 608 can provide the vibration-decision output signal 80 indicative of whether or not the object, e.g., the ferrous gear 11, is vibrating.

Figure 12:
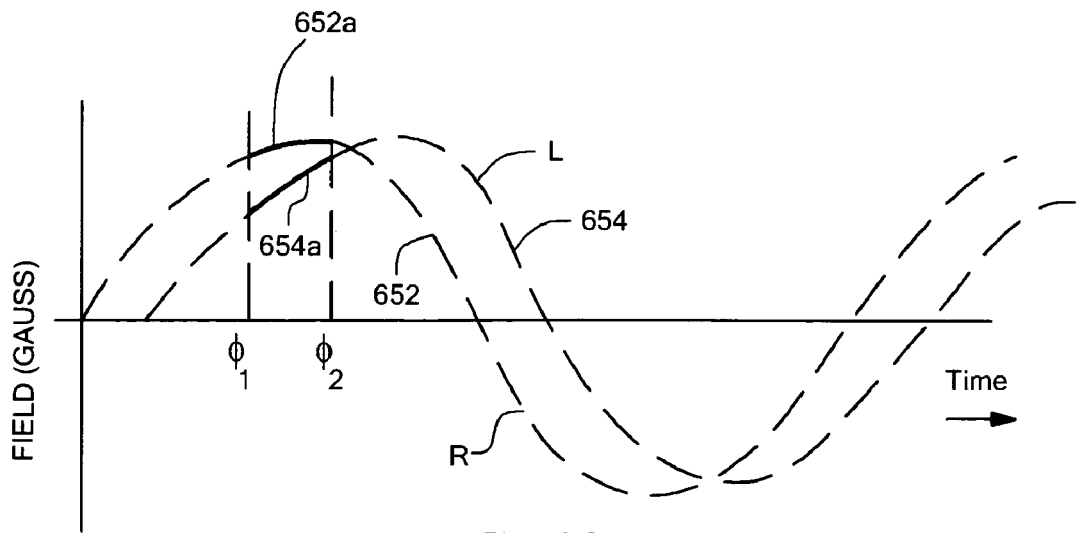
FIG. 12-12B show a series of waveforms including magnetic fields, corresponding output signals of magnetic field sensors, corresponding output signals associated with rotation detectors, and corresponding output signals associated with a running-mode processor of FIG. 11 in response to a vibration of an object.
Figure 12A:
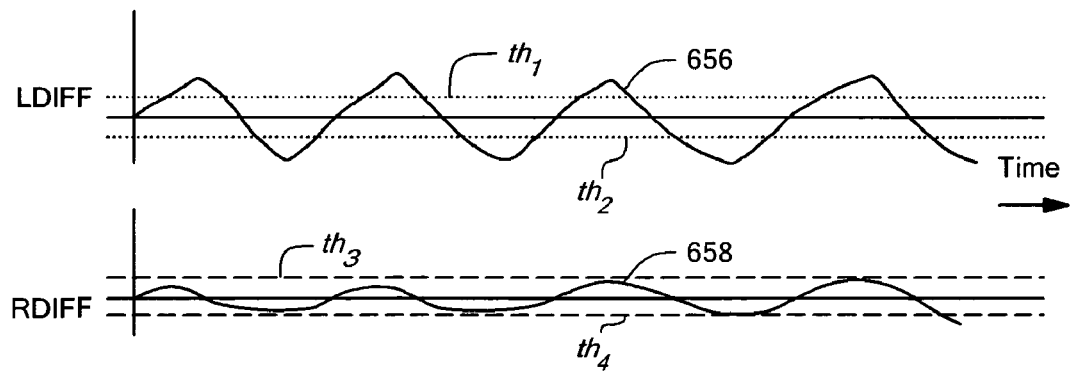
Figure 12B:
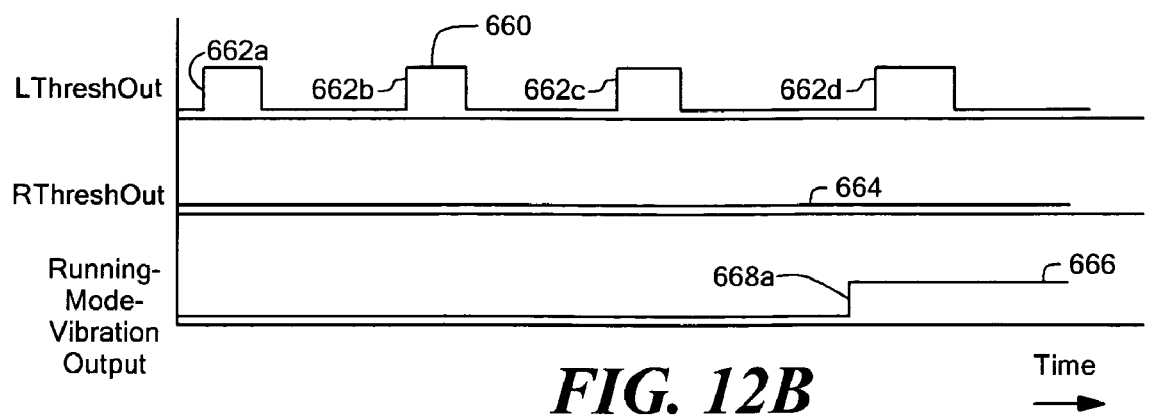

Referring now to FIGS. 12-12B, waveforms are shown which are associated with the running-mode processor 604 of FIG. 11 in response to a vibration. Referring first to FIG. 12, waveforms 652 and 654, shown by phantom lines, represent magnetic fields experienced by the sensor 600 of FIG. 11 if the sensor 600 were in proximity, for example, to the rotating ferrous gear 11 (FIG. 11) continuously rotating in normal operation. Portions 652a, 654a of the magnetic field signals 652, 654, however, are representative of magnetic fields that would be experienced by the sensor 600 in response to a vibration of the ferrous gear 11. More particularly, the magnetic field signal 652a is representative of the magnetic field experienced by the magnetic field sensors 14a, 14b (FIG. 11) and the magnetic field signal 654a is representative of the magnetic field experienced by the magnetic field sensors 14b, 14c (FIG. 11) in response to the vibration.

A complete cycle of the magnetic fields 652, 654 corresponds to one tooth of the ferrous gear passing by the sensor 600, which generally corresponds to only a small portion of a complete revolution of the ferrous gear. The magnetic field signals 652a and 654a associated with the vibration are bounded by a region between phases $\phi 1$ and $\phi 2$. The region between phases $\phi 1$ and $\phi 2$, therefore, corresponds to an even smaller portion of a complete rotation of the ferrous gear 11.

While shown in one position on a time scale, the region between phases $\phi 1$ and $\phi 2$ can be at any position on the time scale. Furthermore, it will be appreciated that the phases $\phi 1$ and $\phi 2$ can have any separation. A larger separation corresponds to a larger magnitude vibration and a smaller separation corresponds to a smaller magnitude vibration.

While the magnetic fields 652, 654 have a frequency associated with the rotation of the ferrous gear in normal operation, it should be appreciated that the magnetic fields 652a, 654a can be experienced at any frequency by the sensor 600 (FIG. 11), determined by a rate of vibration. For example, the ferrous gear 11 rotating back and forth about its axis of rotation, or otherwise vibrating, causes the sensor 600 to experience the magnetic fields 652a, 654a at the frequency of the vibration.

Referring now to FIG. 12A, the sensor 10 generates an LDIFF signal 656 and an RDIFF signal 658. The LDIFF signal 656 can correspond, for example, to the LDIFF signal 58 shown in FIG. 11, and the RDIFF signal 658 can correspond, for example, to the RDIFF signal 28 of FIG. 11. It will be apparent from the magnetic fields 652a, 654a shown in FIG. 12, that the LDIFF signal 656 can have a greater magnitude than the RDIFF signal 658. However if the region bounded by $\phi 1$ and $\phi 2$ (FIG. 12) were to be at a different position along the time scale in FIG. 12, it is equally possible for the LDIFF signal 656 and the RDIFF signal 658 to have other magnitude relationships. In response to a vibration, the LDIFF signal 656 and the RDIFF signal 658 are approximately in phase.

The LDIFF signal 656 and the RDIFF signal 658 can have different wave shapes depending, for example, on slopes in the region bounded by $\phi 1$ and $\phi 2$ of FIG. 12, and on the nature of the vibration. For example, the LDIFF signal 656 has a substantially triangular shape whereas the RDIFF signal 658 has a substantially sinusoidal shape.

Furthermore, as described above, the region bounded by $\phi 1$ and $\phi 2$ (FIG. 12) can be at any position and have any separation relative to the magnetic field signals 652, 654.

Furthermore, the vibration associated with the region bounded by $\phi 1$ and $\phi 2$ can have any type of movement. Therefore, it should be recognized that the LDIFF signal 656 and the RDIFF signal 658 can be more complex waveforms than those shown.

In operation, the LDIFF signal 656 is compared to thresholds th1 and th2 and the RDIFF signal 658 and is compared to thresholds th3 and th4. The thresholds th1, th2 correspond to two states of the threshold 135 of FIG. 2 and the thresholds th3, th4 correspond to two states of a threshold 178 of FIG. 2.

Referring now to FIG. 12B, comparison of the LDIFF signal 656 to the thresholds th1 and th2 shown in FIG. 12A results in an LThreshOut signal 660 having edges 662a-662d. However, because the RDIFF signal 658 is smaller than thresholds th3 and th4, comparison of the RDIFF signal 658 to the thresholds th3 and th4 of FIG. 12A results in an RThreshOut signal 664, which is unresponsive, i.e., has no edges. The LThreshOut signal 660 can correspond, for example, to the LThreshOut signal 62 of FIG. 11, and the RThreshOut signal 664 can correspond to the RThreshOut signal 26 of FIG. 11.

As described above, in an alternate embodiment, the signals of FIGS. 12-12B can be associated with the peak-referenced detectors 20, 54 of FIG. 11, in which case, the thresholds th1-th4 are selected in accordance with the left channel peak-referenced detector 54 and the right channel peak-referenced detector 20 of FIG. 11, and the LThreshOut signal 660 and the RThreshOut signal 664 are instead an LPeakOut signal (not shown) and an RPeakOut signal (not shown) corresponding to the LPeakOut signal 60, 162 and an RPeakOut signal 24 of FIG. 11.

The LThreshOut signal 660 has rising edges 662a-662d and the RThreshOut signal 664 is unresponsive, i.e., has no edges. In operation, the running-mode processor 604 (FIG. 11) detects the unresponsive nature of the RThreshOut signal 664. If the RThreshOut signal 664 remains unresponsive for a predetermined number of edges of the LThreshOut signal 660, a state change 668a in a running-mode-vibration output signal 666 is generated, which is indicative of the vibration. For example, four rising edges 662a-662d can be counted, after which, if the RThreshOut signal 664 remains unresponsive, the running-mode-vibration output signal 666 changes state. Generation of the running-mode-vibration output signal 666 is further described in conjunction with FIGS. 14 and 14A.

The running-mode-vibration output signal 666 can correspond, for example, to the running-mode-vibration output signal 606 of FIG. 11. It will become more apparent from the discussion below in conjunction with FIGS. 14-14A that a running-mode-vibration output signal 666 that changes state is indicative of a vibration and a running-mode-vibration output signal 666 that does not change state is indicative of no vibration, i.e., of a unidirectional rotation in normal operation. Therefore, a vibration can be detected.

It should be recognized that the waveforms shown in FIG. 12-12b represent one example of possible waveforms associated with a vibration. However, other waveforms can be shown to occur in the presence of a vibration for which the LDIFF signal 656 and the RDIFF signal 658 are oppositely related in shape and amplitude, which in turn results in the LThreshOut signal 660 and the RThreshOut signal 664 being essentially interchanged. However, it is also possible that the LDIFF signal 656 and the RDIFF signal 660 can have waveform shapes resulting in no detection of a vibration. In this case, any one of the other vibration detectors 30, 36, 40, and 46 (FIG. 11) can detect the vibration.

Figure 13:
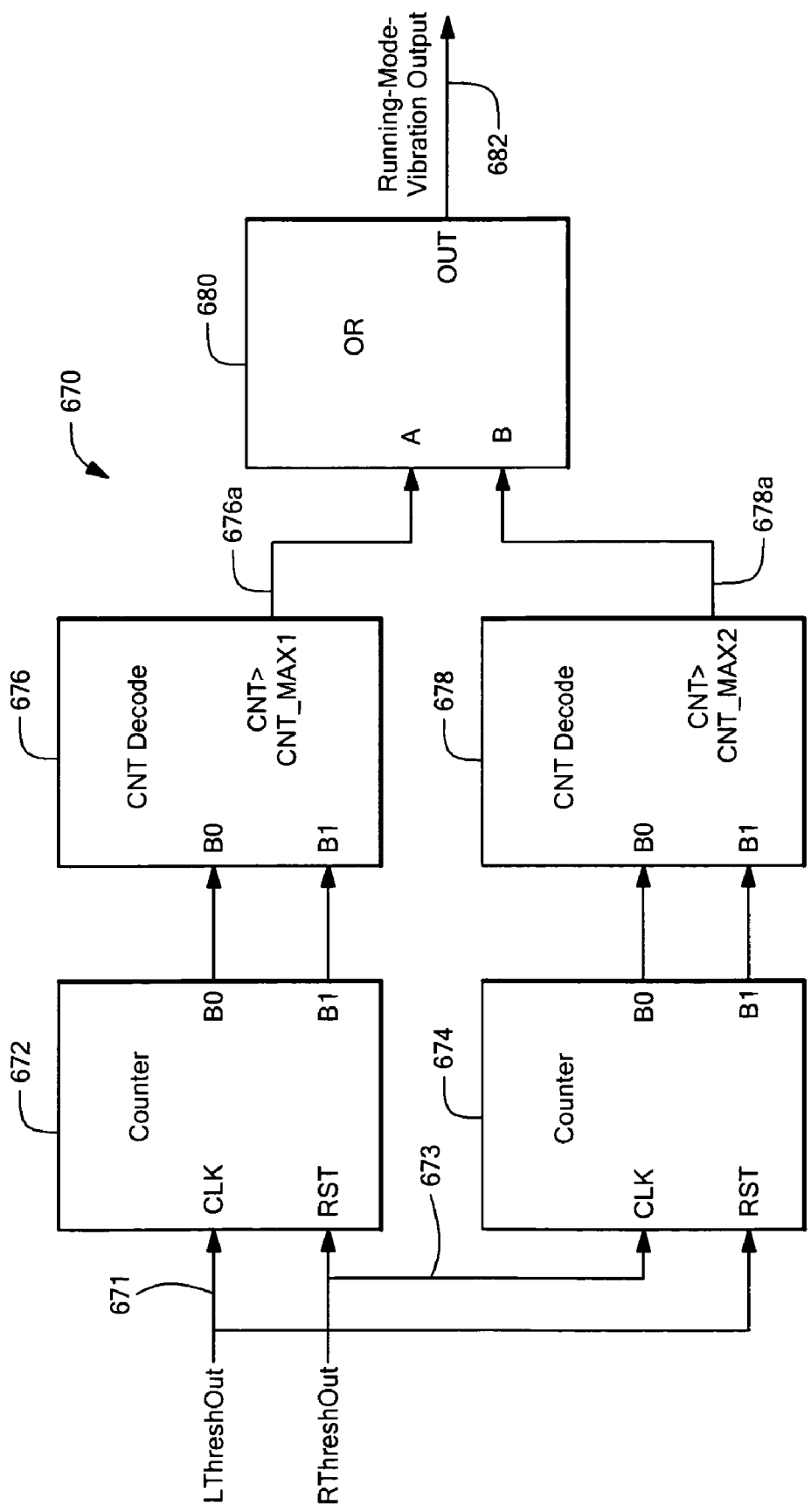
FIG. 13 is a block diagram of a circuit that can be used to provide the running-mode processor of FIG. 11.

Referring now to FIG. 13, an exemplary circuit 70 can provide at least a portion of the running-mode processor 604 of FIG. 11. The circuit 70 includes first and second counters 672 and 674, which receive the LThreshOut signal 671 and the RThreshOut signal 673, which can correspond, for example, to signals 62, 26 of FIG. 11. The first counter 672 counts edges of the LThreshOut signal 671 and the second counter 674 counts edges of the RThreshOut signal 673. The first counter 672 is reset with edges of the RThreshOut signal 673 and the second counter 674 is reset with edges of the LThreshOut signal 671.

A first count decoder 676 detects if a digital count from the first counter 672 has exceeded a first count value, denoted as CNT_MAX1, and, in response thereto, generates a state change in a first intermediate signal 676a indicative of a vibration. Similarly, a second count decoder 678 detects if a digital count from the second counter 674 has exceeded a second count value, identified as CNT_MAX2, and, in response thereto, generates a state change in a second intermediate signal 678a indicative of the vibration. An OR gate 680 receives the first and second intermediate signals 676a, 678a. In response to either of the intermediate signals 676a, 678a indicating the vibration, the running-mode-vibration output signal 682 indicates the vibration. The running-mode-vibration output signal 682 can correspond, for example, to the running-mode-vibration output signal 606 of FIG. 11.

The first and second count values, CNT_MAX1 and CNT_MAX2 can be the same or different. In one particular embodiment, both the first and second count values are four.

Figure 14:
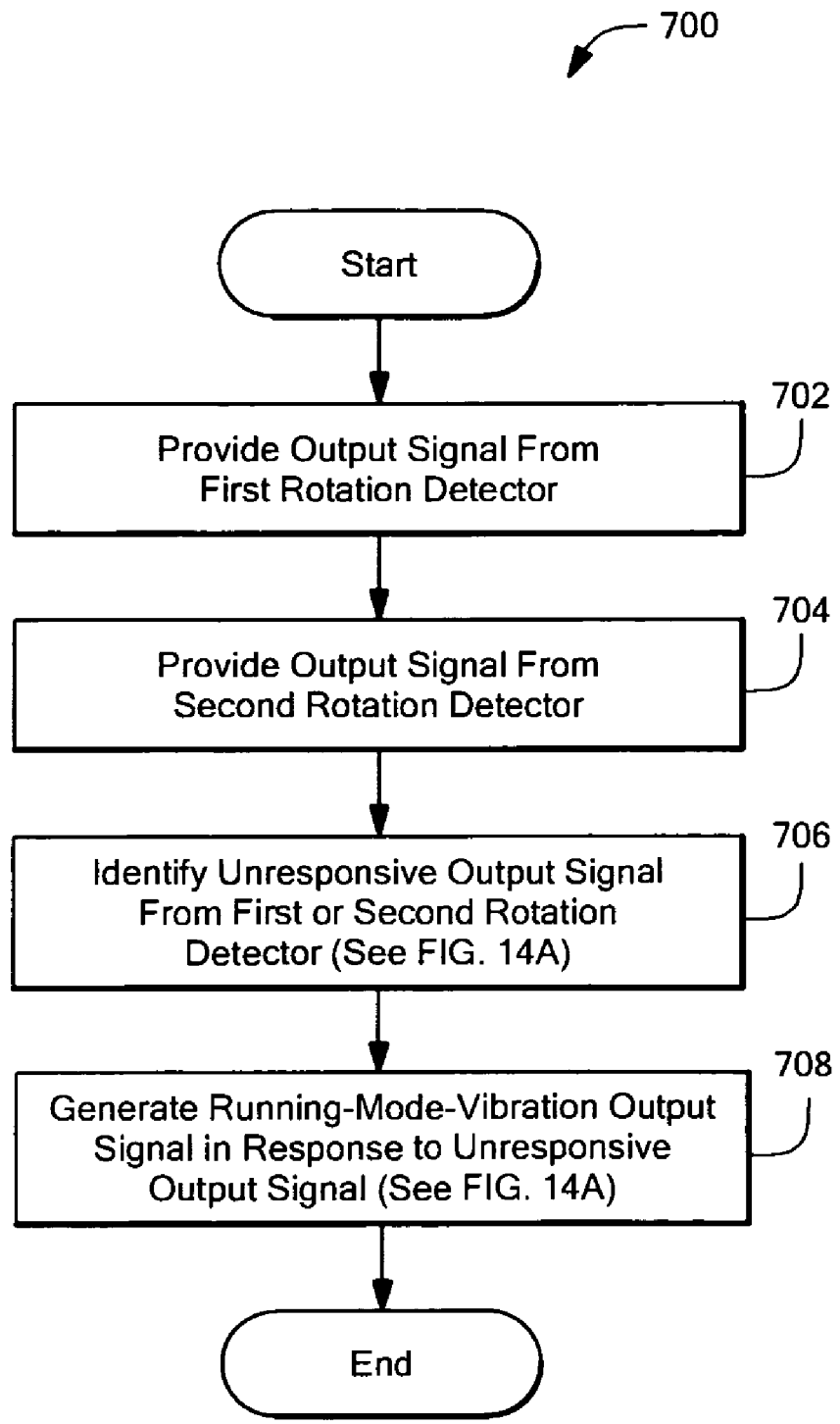
FIG. 14 is a flow chart showing a process of generating a running-mode-vibration output signal associated with the running-mode processor of FIGS. 11 and 13.

Referring now to FIG. 14, a process 700 associated with the running-mode processor 604 of FIG. 11 and with the circuit 70 of FIG. 13 begins at block 702, where a first rotation detector provides an output signal, for example, the LThreshOut signal 62, 671 of FIGS. 11 and 13, respectively. Similarly, at block 704, a second rotation detector provides an output signal 26, 673, for example, the RThreshOut signal 26, 673 of FIGS. 11 and 13, respectively.

At block 706, an unresponsive output from the first or second rotation detectors is identified. For example, the unresponsive output can correspond to the unresponsive RThreshOut signal 664 of FIG. 12B. At block 706, a running-mode-vibration output signal is generated in response to the identified unresponsive output. The running-mode-vibration output signal can correspond, for example, to the running-mode-vibration output signal 666 of FIG. 12B having the edge 668a.

Figure 14A:
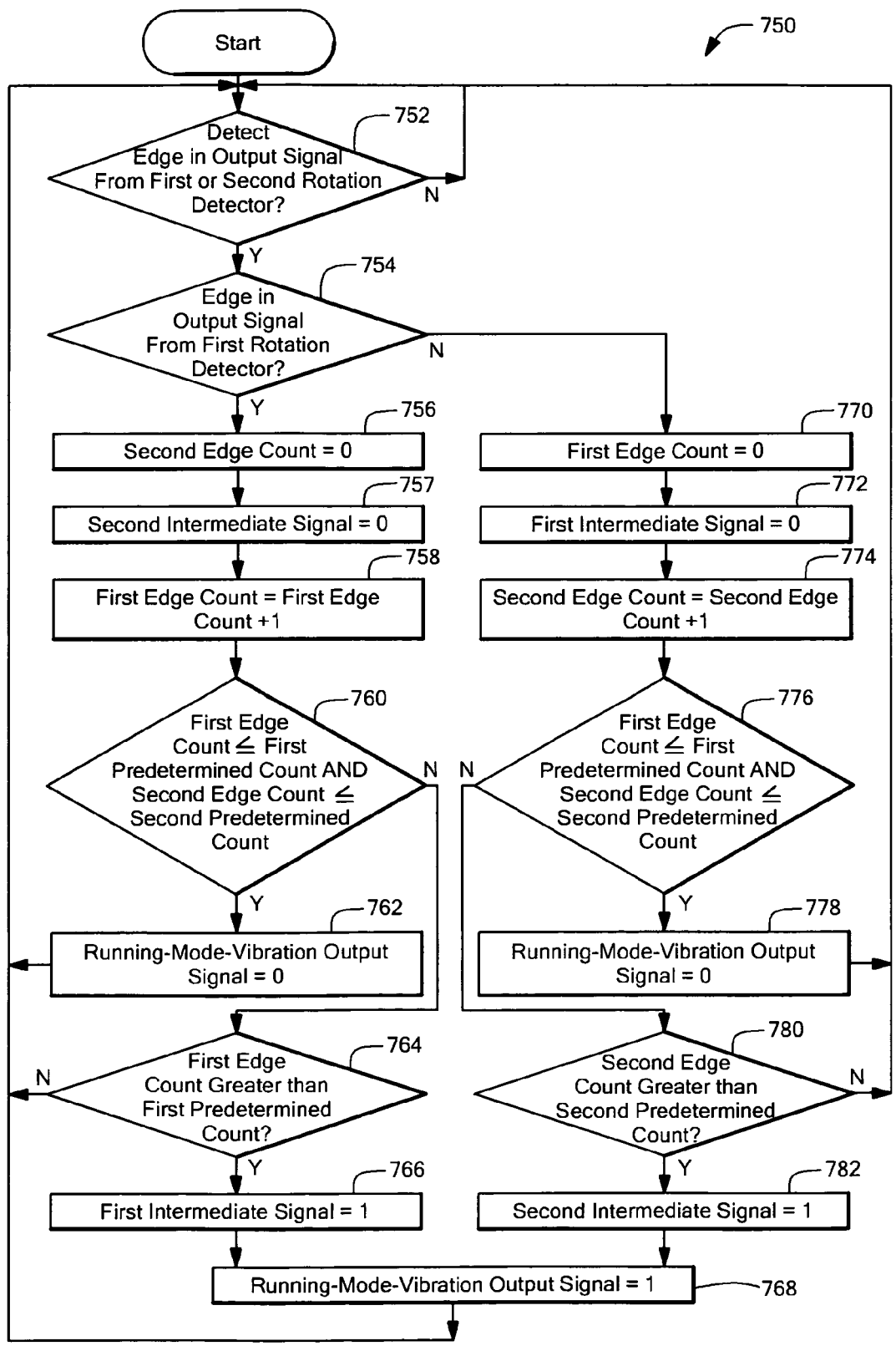
FIG. 14A is a flow chart showing further detail associated with the process of FIG. 14.

Referring now to FIG. 14A, a process 750 can be used to identify an unresponsive output signal in accordance with block 706 of FIG. 1 and to generate the running-mode-vibration output signal in accordance with block 708 of FIG. 14. The process 750 also corresponds to functions associated with the circuit 70 of FIG. 13.

The process 750 begins at decision block 752, where the process 750 loops waiting for an edge in the output signals from either a first or a second rotation detector. For example, the edge can be either in the LThreshOut signal 62, 671 or in the RThreshOut signal 26, 673 of FIGS. 11 and 13, respectively.

If an edge is detected, the process 750 continues to decision block 754 where a decision is made as to whether the edge was in the output signal from the first rotation detector. If the edge was from the first rotation detector, the process continues to block 756.

At block 756, a second edge count is reset to zero. For example, the second counter 674 of FIG. 13 is reset to zero by the LThreshOut signal 671.

At block 757, a second intermediate signal is set to zero. For example, the second intermediate signal 678a of FIG. 13 is set to zero.

At block 758 a first edge count is incremented by one. For example a state of the first counter 672 of FIG. 1 is incremented by one.

At decision block 760, it is decided whether the count of the first counter is less than or equal to (LE) a first predetermined count and if the count of the second counter is less than or equal to a second predetermined count. The first predetermined count can correspond, for example, to the CNT_MAX1 of FIG. 13 and the second predetermined count can correspond to the CNT_MAX2 of FIG. 13.

If both of the above described conditions are not met, then the process continues to decision block 764, where it is decided if the count of the first counter is greater than the first predetermined count. If the count is greater, the process continues to block 766, where the first intermediate signal is set to one. The first intermediate signal can correspond, for example, to the first intermediate signal 676a of FIG. 13.

At block 768, the running-mode-vibration output signal is set to one, corresponding to a detected vibration. The running-mode-vibration output signal can correspond, for example to the running-mode-vibration output signal 606 of FIG. 11, 666 of FIG. 12B, and 682 of FIG. 13. The process returns to the decision block 752 and loops waiting for another detected edge.

If at decision block 760, it is determined that the condition is met, the process proceed to block 762, where the running-mode-vibration output signal is set to zero. The process returns to the decision block 752 and loops waiting for another detected edge.

If at decision block 754, the detected edge is not from the first rotation detector, it must be from the second rotation detector, and the process continues at block 770, where the first edge count is set to zero. For example the first counter 672 of FIG. 13 is reset to zero.

At block 772 the first intermediate signal is set to zero. The first intermediate signal can correspond, for example, to the first intermediate signal 676a of FIG. 13.

At block 774, the second edge count is incremented. For example the second counter 674 of FIG. 13 is incremented.

At decision block 776, it is decided whether the count of the first counter is less than or equal to (LE) the predetermined count and the count of the second counter is less than or equal to the second predetermined count.

If both of the above described conditions are not met, then the process continues to decision block 780, where it is decided if the count of the second counter is greater than the second predetermined count. If the count is greater, the process continues to block 782, where the second intermediate signal is set to one. The second intermediate signal can correspond, for example, to the second intermediate signal 678a of FIG. 13.

At block 768, the running-mode-vibration output signal is set to one, corresponding to a detected vibration. The process returns to the decision block 752 and loops waiting for another detected edge.

If at decision block 776, it is determined that the condition is met, the process proceed to block 762, where the running-mode-vibration output signal is set to zero. The process returns to the decision block 752 and loops waiting for another detected edge.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. Apparatus for detecting a vibration of an object adapted for rotation, comprising:
   a plurality of magnetic field sensors for generating an RDIFF signal proportional to a magnetic field at a first location relative to the object and an LDIFF signal proportional to a magnetic field at a second location relative to the object;
   at least two rotation detectors, wherein a first one of the rotation detectors is coupled to at least one of the magnetic field sensors and is responsive to the RDIFF signal for providing a first output signal indicative of rotation of the object and wherein a second one of the rotation detectors is coupled to at least one of the magnetic field sensors and is responsive to the LDIFF signal for providing a second output signal indicative of rotation of the object; and
   a vibration processor responsive to the first and second output signals from the at least two rotation detectors for detecting the vibration of the object, the vibration processor comprising one or more vibration detectors including:
      a phase-overlap processor to identify a first signal region associated with the RDIFF signal and a second signal region associated with the LDIFF signal, to identify a first overlap as an overlap of the first signal region and the second signal region, and to generate a phase-overlap output signal indicative of the vibration of the object in response to the first overlap.

2. The apparatus of claim 1, wherein the apparatus comprises two rotation detectors, each of a type selected from a peak-referenced detector and a threshold detector.

3. The apparatus of claim 1, wherein the apparatus comprises four rotation detectors, each of a type selected from a peak-referenced detector and a threshold detector.

4. The apparatus of claim 1, wherein the first signal region is associated with a percentage range of a peak-to-peak magnitude of the RDIFF signal and the second signal region is associated with a percentage range of a peak-to-peak magnitude of the LDIFF signal.

5. The apparatus of claim 4, wherein the percentage range of the peak-to-peak magnitude of the RDIFF signal is substantially equal to the percentage range of the peak-to-peak magnitude of the LDIFF signal.

6. The apparatus of claim 1, wherein the one or more vibration detectors includes another different type of vibration detector, the vibration processor further comprising a combining processor coupled to the one or more vibration detectors to combine output signals of the one or more vibration detectors to generate a vibration-decision output signal indicative of the vibration of the object.

7. The apparatus of claim 1, wherein the apparatus is configured for use in an automobile.

8. The apparatus of claim 1, wherein the first signal region is associated with a first percentage range spanning about seventy to eighty-five percent of a peak-to-peak magnitude of the RDIFF signal and the second signal region is associated with the first percentage range spanning about seventy to eighty-five percent of a peak-to-peak magnitude of the LDIFF signal.

9. The apparatus of claim 1, wherein the phase-overlap processor is also to identify a third signal region associated with the RDIFF signal and a fourth signal region associated with the LDIFF signal, to identify a second overlap as an overlap of the third signal region and the fourth signal region, and to generate the phase-overlap output signal indicative of the vibration of the object in response to the first and second overlaps.

10. The apparatus of claim 9, wherein the first signal region is associated with a first percentage range spanning about seventy to eighty-five percent of a peak-to-peak magnitude of the RDIFF signal, the second signal region is associated with the first percentage range spanning about seventy to eighty-five percent of a peak-to-peak magnitude of the LDIFF signal, the third signal region is associated with a second percentage range spanning about fifteen to about thirty percent of a peak-to-peak magnitude of the RDIFF signal, and the second signal region is associated with the second percentage range spanning about fifteen to about thirty percent of a peak-to-peak magnitude of the LDIFF signal.

11. The apparatus of claim 1, further comprising an output protocol processor coupled to the vibration processor, the output protocol processor for providing an output signal indicative of the vibration of the object and also indicative of the rotation of the object.

12. The apparatus of claim 11, wherein the output signal provided by the output protocol processor is indicative of the rotation of the object when no vibration is detected by the vibration processor, and wherein the output signal provided by the output protocol processor achieves a substantially static signal value when a vibration is detected by the by the vibration processor.

* * * * *

UNITED STATES PATENT AND TRADEMARK OFFICE
CERTIFICATE OF CORRECTION

PATENT NO.      : 7,365,530 B2
APPLICATION NO. : 10/942577
DATED           : April 29, 2008
INVENTOR(S)     : Bailey et al.

It is certified that error appears in the above-identified patent and that said Letters Patent is hereby corrected as shown below:

On the Title Page Item 57 Abstract, line 19 delete "vibration the" and replace with --vibration of the--.

Column 5, line 19 delete "mean" and replace with --means--.

Column 5, line 59 delete "FIG. 4-4B" and replace with --FIGS. 4-4B--.

Column 6, line 23 delete "FIG. 12-12B" and replace with --FIGS. 2-12B--.

Column 7, line 42 delete "14c the" and replace with --14c, the--.

Column 9, line 2 delete "one of more or" and replace with --one or more of--.

Column 10, line 45 delete "Two fill" and replace with --Two full--.

Column 10, line 47 delete "is" and replace with --are--.

Column 10, line 63 delete "of" and replace with --or--.

Column 11, line 51 delete "a" and replace with --with a--.

Column 12, line 10 delete "eight-five" and replace with --eighty-five--.

Column 12, line 46 delete "intersect" and replace with --intersects--.

Column 13, line 14 delete "or" and replace with --of--.

Column 14, line 45 delete "signal" and replace with --signals--.

Column 14, lines 58-59 delete "signal 60, 162 and an" and replace with --signals 60, 162 and--.

Column 14, line 59 delete "signal" and replace with --signals--.

Column 15, line 19 delete "the to the" and replace with --to the--.

Column 15, lines 30-31 delete "FIG. 3-3C" and replace with --FIGS. 3-3C--.

Column 18, line 66 delete "362a, 363b" and replace with --362a, 362b--.

UNITED STATES PATENT AND TRADEMARK OFFICE
CERTIFICATE OF CORRECTION

PATENT NO. : 7,365,530 B2  
APPLICATION NO. : 10/942577  
DATED : April 29, 2008  
INVENTOR(S) : Bailey et al.

It is certified that error appears in the above-identified patent and that said Letters Patent is hereby corrected as shown below:

Column 21, line 47 delete "indicated" and replace with --indicates--.

Column 24, line 18 delete "and is" and replace with --is--.

Column 24, line 42 delete "signal" and replace with --signals--.

Column 25, lines 1-2 delete "FIG. 12-12b" and replace with --FIGS. 12-12b--.

Column 25, line 47 delete "signal" and replace with --signals--.

Column 25, line 49 delete "signal" and replace with --signals--.

Column 26, line 2 delete "signal" and replace with --signals--.

Column 26, line 3 delete "signal" and replace with --signals--.

Column 26, line 26 delete "above described" and replace with --above-described--.

Column 26, line 41 delete "proceed" and replace with --proceeds--.

Column 26, line 60 delete "above described" and replace with --above-described--.

Column 27, line 6 delete "proceed" and replace with --proceeds--.

Column 28, line 54 delete "by the by the" and replace with --by the--.

Signed and Sealed this

Second Day of June, 2009

JOHN DOLL  
*Acting Director of the United States Patent and Trademark Office*